(12) United States Patent
Chevallier et al.

(10) Patent No.: US 11,502,249 B2
(45) Date of Patent: *Nov. 15, 2022

(54) MEMORY ELEMENT WITH A REACTIVE METAL LAYER

(71) Applicant: Hefei Reliance Memory Limited, Hefei (CN)

(72) Inventors: Christophe J. Chevallier, Palo Alto, CA (US); Steve Kuo-Ren Hsia, San Jose, CA (US); Wayne Kinney, Emmett, ID (US); Steven Longcor, Mountain View, CA (US); Darrell Rinerson, Cupertino, CA (US); John Sanchez, Palo Alto, CA (US); Philip F. S. Swab, Santa Rosa, CA (US); Edmond R. Ward, Monte Sereno, CA (US)

(73) Assignee: Hefei Reliance Memory Limited, Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/028,909

(22) Filed: Sep. 22, 2020

(65) Prior Publication Data

US 2021/0013262 A1    Jan. 14, 2021

Related U.S. Application Data

(60) Continuation of application No. 16/412,015, filed on May 14, 2019, now Pat. No. 10,833,125, which is a
(Continued)

(51) Int. Cl.
*H01L 45/00* (2006.01)
*H01L 27/24* (2006.01)
(Continued)

(52) U.S. Cl.
CPC .......... *H01L 45/1233* (2013.01); *G11C 11/16* (2013.01); *G11C 11/5685* (2013.01);
(Continued)

(58) Field of Classification Search
CPC . G11C 11/5685; G11C 11/16; G11C 13/0002; G11C 13/0007; G11C 13/004;
(Continued)

(56) References Cited

U.S. PATENT DOCUMENTS 3,886,577 A    5/1975   Buckley
4,843,059 A    6/1989   Deslandes et al.
(Continued)

FOREIGN PATENT DOCUMENTS

EP      1376598 A1       1/2001
JP      2003-092387 A    3/2003
(Continued)

OTHER PUBLICATIONS

Rinerson, Darrell, U.S. Appl. No. 12/286,723, filed Oct. 1, 2008, Notice of Allowance and Fee(s) Due dated Oct. 6, 2009. 8 pages.
(Continued)

*Primary Examiner* — Cheung Lee
(74) *Attorney, Agent, or Firm* — Sheppard Mullin Richter & Hampton LLP

(57) ABSTRACT

A re-writeable non-volatile memory device including a re-writeable non-volatile two-terminal memory element (ME) having tantalum. The ME including a first terminal, a second terminal, a first layer of a conductive metal oxide (CMO), and a second layer in direct contact with the first layer. The second layer and the first layer being operative to store at least one-bit of data as a plurality of resistive states, and the first and second layer are electrically in series with each other and with the first and second terminals.

19 Claims, 8 Drawing Sheets

Related U.S. Application Data continuation of application No. 15/797,716, filed on Oct. 30, 2017, now Pat. No. 10,340,312, which is a continuation of application No. 15/393,545, filed on Dec. 29, 2016, now Pat. No. 9,806,130, which is a continuation of application No. 14/850,702, filed on Sep. 10, 2015, now Pat. No. 9,570,515, which is a continuation of application No. 14/167,694, filed on Jan. 29, 2014, now Pat. No. 9,159,408, which is a continuation of application No. 13/272,985, filed on Oct. 13, 2011, now Pat. No. 8,675,389, which is a continuation of application No. 12/931,967, filed on Feb. 15, 2011, now abandoned, which is a continuation of application No. 12/653,486, filed on Dec. 14, 2009, now Pat. No. 7,889,539, which is a continuation of application No. 12/286,723, filed on Oct. 1, 2008, now Pat. No. 7,633,790, which is a continuation of application No. 12/215,958, filed on Jun. 30, 2008, now Pat. No. 8,062,942, which is a division of application No. 11/473,005, filed on Jun. 22, 2006, now Pat. No. 7,394,679, which is a continuation of application No. 10/773,549, filed on Feb. 6, 2004, now Pat. No. 7,082,052.

(51) Int. Cl.
   *G11C 11/56* (2006.01)
   *G11C 13/00* (2006.01)
   *G11C 11/16* (2006.01)

(52) U.S. Cl.
   CPC ........ *G11C 13/0002* (2013.01); *G11C 13/004* (2013.01); *G11C 13/0007* (2013.01); *G11C 13/0069* (2013.01); *G11C 13/0097* (2013.01); *H01L 27/24* (2013.01); *H01L 27/2463* (2013.01); *H01L 27/2481* (2013.01); *H01L 45/04* (2013.01); *H01L 45/06* (2013.01); *H01L 45/1253* (2013.01); *H01L 45/146* (2013.01); *H01L 45/147* (2013.01); *H01L 45/1633* (2013.01); *H01L 45/1658* (2013.01); *G11C 2013/009* (2013.01); *G11C 2213/15* (2013.01); *G11C 2213/31* (2013.01); *G11C 2213/32* (2013.01); *G11C 2213/71* (2013.01); *G11C 2213/77* (2013.01); *G11C 2213/79* (2013.01)

(58) Field of Classification Search
   CPC ............ G11C 13/0069; G11C 13/0097; G11C 2213/15; G11C 2213/31; G11C 2213/32; G11C 2213/71; G11C 2213/77; G11C 2213/79; H01L 27/2463; H01L 45/147; H01L 27/24; H01L 27/2436; H01L 27/2481; H01L 45/04; H01L 45/06; H01L 45/1233; H01L 45/1253; H01L 45/146; H01L 45/1633; H01L 45/1658
   See application file for complete search history.

(56) References Cited

U.S. PATENT DOCUMENTS

| | | | |
|---|---|---|---|
| 5,296,716 | A | 3/1994 | Ovshinsky et al. |
| 5,479,317 | A | 12/1995 | Ramesh |
| 5,483,482 | A | 1/1996 | Yamada et al. |
| 5,536,947 | A | 7/1996 | Klersy et al. |
| 5,625,587 | A | 4/1997 | Peng et al. |
| 5,719,416 | A | 2/1998 | Yoshimori et al. |
| 5,835,396 | A | 11/1998 | Zhang |
| 5,894,135 | A | 4/1999 | Yamamoto et al. |
| 5,985,757 | A | 11/1999 | Lee et al. |
| 5,991,193 | A | 11/1999 | Gallagher et al. |
| 6,034,882 | A | 3/2000 | Johnson et al. |
| 6,128,214 | A | 10/2000 | Kuekes et al. |
| 6,140,672 | A | 10/2000 | Arita et al. |
| 6,185,121 | B1 | 2/2001 | O'Neill |
| 6,185,122 | B1 | 2/2001 | Johnson et al. |
| 6,204,139 | B1 | 3/2001 | Liu et al. |
| 6,236,076 | B1 | 5/2001 | Arita |
| 6,259,644 | B1 | 7/2001 | Tran et al. |
| 6,326,671 | B1 | 12/2001 | Nagano et al. |
| 6,351,406 | B1 | 2/2002 | Johnson et al. |
| 6,385,074 | B1 | 5/2002 | Johnson et al. |
| 6,407,953 | B1 | 6/2002 | Cleeves |
| 6,420,215 | B1 | 7/2002 | Knall et al. |
| 6,458,621 | B1 | 10/2002 | Beck |
| 6,459,095 | B1 | 10/2002 | Heath et al. |
| 6,473,332 | B1 | 10/2002 | Ignatiev et al. |
| 6,487,106 | B1 | 11/2002 | Kozicki |
| 6,504,753 | B1 | 1/2003 | Scheuerlein et al. |
| 6,515,888 | B2 | 2/2003 | Johnson et al. |
| 6,515,904 | B2 | 2/2003 | Moore et al. |
| 6,522,594 | B1 | 2/2003 | Scheuerlein |
| 6,525,953 | B1 | 2/2003 | Johnson |
| 6,528,365 | B2 | 3/2003 | Nagano et al. |
| 6,531,371 | B2 | 3/2003 | Hsu et al. |
| 6,534,403 | B2 | 3/2003 | Cleeves |
| 6,545,891 | B1 | 4/2003 | Tringali et al. |
| 6,569,745 | B2 | 5/2003 | Hsu |
| 6,599,796 | B2 | 7/2003 | Mei et al. |
| 6,631,085 | B2 | 10/2003 | Kleveland et al. |
| 6,635,603 | B1 | 10/2003 | Batlogg et al. |
| 6,642,539 | B2 | 11/2003 | Ramesh et al. |
| 6,657,888 | B1 | 12/2003 | Doudin et al. |
| 6,693,821 | B2 | 2/2004 | Hsu et al. |
| 6,731,528 | B2 | 5/2004 | Hush et al. |
| 6,753,561 | B1 | 6/2004 | Rinerson et al. |
| 6,759,249 | B2 | 7/2004 | Zhuang et al. |
| 6,774,054 | B1 | 8/2004 | Zhang et al. |
| 6,777,248 | B1 | 8/2004 | Nabatame et al. |
| 6,788,576 | B2 | 9/2004 | Roizin |
| 6,807,088 | B2 | 10/2004 | Tsuchida |
| 6,816,410 | B2 | 11/2004 | Kleveland et al. |
| 6,822,903 | B2 | 11/2004 | Scheuerlein et al. |
| 6,825,489 | B2 | 11/2004 | Kozicki |
| 6,834,013 | B2 | 12/2004 | Fan et al. |
| 6,836,421 | B2 | 12/2004 | Rinerson et al. |
| 6,839,269 | B2 | 1/2005 | Iwata et al. |
| 6,850,455 | B2 | 2/2005 | Rinerson et al. |
| 6,855,647 | B2 | 2/2005 | Beck et al. |
| 6,856,536 | B2 | 2/2005 | Rinerson et al. |
| 6,859,382 | B2 | 2/2005 | Rinerson et al. |
| 6,882,553 | B2 | 4/2005 | Nejad et al. |
| 6,903,361 | B2 | 6/2005 | Gilton |
| 6,917,539 | B2 | 7/2005 | Rinerson et al. |
| 6,927,430 | B2 | 8/2005 | Hsu |
| 6,937,505 | B2 | 8/2005 | Morikawa |
| 6,939,724 | B2 | 9/2005 | Zhuang et al. |
| 6,940,113 | B2 | 9/2005 | Hsu et al. |
| 6,940,744 | B2 | 9/2005 | Rinerson et al. |
| 6,965,137 | B2 | 11/2005 | Kinney et al. |
| 6,970,375 | B2 | 11/2005 | Rinerson et al. |
| 6,972,427 | B2 | 12/2005 | Roehr et al. |
| 6,972,985 | B2 | 12/2005 | Rinerson et al. |
| 6,985,378 | B2 | 1/2006 | Kozicki |
| 6,998,698 | B2 | 2/2006 | Inoue et al. |
| 7,001,846 | B2 | 2/2006 | Hsu |
| 7,002,197 | B2 | 2/2006 | Perner et al. |
| 7,005,717 | B2 | 2/2006 | Eisenbeiser et al. |
| 7,009,909 | B2 | 3/2006 | Rinerson et al. |
| 7,020,006 | B2 | 3/2006 | Chevallier et al. |
| 7,022,572 | B2 | 4/2006 | Scheuerlein et al. |
| 7,023,743 | B2 | 4/2006 | Nejad et al. |
| 7,029,924 | B2 | 4/2006 | Hsu et al. |
| 7,046,550 | B1 | 5/2006 | Reohr et al. |
| 7,057,914 | B2 | 6/2006 | Rinerson et al. |
| 7,060,586 | B2 | 6/2006 | Li et al. |
| 7,075,817 | B2 | 7/2006 | Rinerson et al. |
| 7,079,442 | B2 | 7/2006 | Rinerson et al. |
| 7,082,052 | B2 | 7/2006 | Rinerson et al. |

(56) References Cited

U.S. PATENT DOCUMENTS

| | | |
|---|---|---|
| 7,139,667 B2 | 11/2006 | Rothman et al. |
| 7,141,481 B2 | 11/2006 | Hsu et al. |
| 7,148,533 B2 | 12/2006 | Hsu et al. |
| 7,177,181 B1 | 2/2007 | Scheuerlein |
| 7,188,534 B2 | 3/2007 | Tombs et al. |
| 7,227,775 B2 | 6/2007 | Rinerson et al. |
| 7,256,415 B2 | 8/2007 | Furukawa et al. |
| 7,292,957 B1 | 11/2007 | Schell |
| 7,326,979 B2 | 2/2008 | Rinerson et al. |
| 7,339,811 B2 | 3/2008 | Nejad et al. |
| 7,360,453 B2 | 4/2008 | Rieder et al. |
| 7,363,800 B2 | 4/2008 | Gysling |
| 7,372,753 B1 | 5/2008 | Rinerson et al. |
| 7,379,364 B2 | 5/2008 | Siau et al. |
| 7,394,679 B2 * | 7/2008 | Rinerson ............. H01L 45/06 365/148 |
| 7,394,680 B2 | 7/2008 | Toda et al. |
| 7,400,006 B1 | 7/2008 | Rinerson et al. |
| 7,405,960 B2 | 7/2008 | Cho et al. |
| 7,408,212 B1 | 8/2008 | Luan et al. |
| 7,411,811 B2 | 8/2008 | Inoue |
| 7,412,903 B2 | 8/2008 | Rieder et al. |
| 7,417,271 B2 | 8/2008 | Genrikh et al. |
| 7,443,711 B1 | 10/2008 | Stewart et al. |
| 7,457,147 B2 | 11/2008 | Rinerson et al. |
| 7,460,385 B2 | 12/2008 | Gruber et al. |
| 7,463,546 B2 | 12/2008 | Fasoli et al. |
| 7,464,621 B2 | 12/2008 | Mathis et al. |
| 7,498,600 B2 | 3/2009 | Cho et al. |
| 7,505,344 B2 | 3/2009 | Scheuerlein |
| 7,508,695 B2 | 3/2009 | Sugita |
| 7,538,338 B2 | 5/2009 | Rinerson et al. |
| 7,554,873 B2 | 6/2009 | Lee et al. |
| 7,608,467 B2 | 10/2009 | Wu et al. |
| 7,633,790 B2 | 12/2009 | Rinerson et al. |
| 7,639,521 B2 | 12/2009 | Baek et al. |
| 7,643,344 B2 | 1/2010 | Choi |
| 7,701,791 B2 | 4/2010 | Rinerson et al. |
| 7,706,177 B2 | 4/2010 | Petti |
| 7,719,876 B2 | 5/2010 | Chevallier et al. |
| 7,733,685 B2 | 6/2010 | Scheuerlein et al. |
| 7,742,323 B2 | 6/2010 | Rinerson et al. |
| 7,782,650 B2 | 8/2010 | Bertin et al. |
| 7,842,991 B2 | 11/2010 | Cho et al. |
| 7,884,349 B2 | 2/2011 | Rinerson et al. |
| 7,889,539 B2 | 2/2011 | Rinerson et al. |
| 7,898,841 B2 | 3/2011 | Chevallier et al. |
| 7,902,867 B2 | 3/2011 | Mouttet |
| 7,902,868 B2 | 3/2011 | Norman |
| 7,902,869 B1 | 3/2011 | Carter |
| 7,924,608 B2 | 4/2011 | Campbell |
| 7,929,345 B2 | 4/2011 | Issaq |
| 7,955,871 B2 | 6/2011 | Wu et al. |
| 7,961,494 B2 | 6/2011 | Scheuerlein |
| 7,983,065 B2 | 7/2011 | Samachisa |
| 7,985,963 B2 | 7/2011 | Rinerson et al. |
| 8,062,942 B2 | 11/2011 | Rinerson et al. |
| 8,139,409 B2 | 3/2012 | Chevallier et al. |
| 8,482,958 B2 | 7/2013 | Hayakawa et al. |
| 8,675,389 B2 | 3/2014 | Chevallier et al. |
| 8,891,276 B2 | 11/2014 | Siau et al. |
| 8,937,292 B2 | 1/2015 | Bateman |
| 9,159,408 B2 | 10/2015 | Chevallier et al. |
| 9,570,515 B2 | 2/2017 | Chevallier et al. |
| 9,806,130 B2 * | 10/2017 | Chevallier .............. H01L 27/24 |
| 10,340,312 B2 | 7/2019 | Chevallier et al. |
| 2001/0055838 A1 | 12/2001 | Walker et al. |
| 2003/0003674 A1 | 1/2003 | Hsu et al. |
| 2003/0003675 A1 | 1/2003 | Hsu |
| 2003/0043633 A1 | 3/2003 | Forbes et al. |
| 2003/0132456 A1 | 7/2003 | Miyai et al. |
| 2003/0137869 A1 | 7/2003 | Kozicki |
| 2003/0148545 A1 | 8/2003 | Zhuang et al. |
| 2003/0151959 A1 | 8/2003 | Tringali et al. |
| 2003/0156445 A1 | 8/2003 | Zhuang et al. |
| 2004/0109353 A1 | 6/2004 | Matsuoka |
| 2004/0141369 A1 | 7/2004 | Noguchi |
| 2004/0159828 A1 | 8/2004 | Rinerson et al. |
| 2004/0159867 A1 | 8/2004 | Kinney et al. |
| 2004/0159868 A1 | 8/2004 | Rinerson et al. |
| 2004/0159869 A1 | 8/2004 | Rinerson et al. |
| 2004/0161888 A1 | 8/2004 | Rinerson et al. |
| 2004/0170040 A1 | 9/2004 | Rinerson et al. |
| 2004/0180507 A1 | 9/2004 | Zhang et al. |
| 2005/0018516 A1 | 1/2005 | Chevallier et al. |
| 2005/0135148 A1 | 6/2005 | Chevallier et al. |
| 2005/0151156 A1 * | 7/2005 | Wu ....................... H01L 45/12 257/107 |
| 2005/0174835 A1 | 8/2005 | Rinerson et al. |
| 2005/0243595 A1 | 11/2005 | Rinerson et al. |
| 2005/0269626 A1 | 12/2005 | Forbes |
| 2006/0018149 A1 | 1/2006 | Rinerson et al. |
| 2006/0023497 A1 | 2/2006 | Kawazoe et al. |
| 2006/0050598 A1 | 3/2006 | Rinerson et al. |
| 2006/0054937 A1 | 3/2006 | Lucovsky et al. |
| 2006/0131695 A1 | 6/2006 | Kuekes et al. |
| 2006/0171200 A1 | 8/2006 | Rinerson et al. |
| 2006/0245241 A1 | 11/2006 | Rinerson et al. |
| 2006/0245243 A1 | 11/2006 | Rinerson et al. |
| 2007/0223282 A1 | 9/2007 | Sarig |
| 2007/0253245 A1 | 11/2007 | Ranjan et al. |
| 2008/0068875 A1 | 3/2008 | Choi |
| 2008/0079029 A1 | 4/2008 | Williams |
| 2008/0090337 A1 | 4/2008 | Williams |
| 2008/0090401 A1 | 4/2008 | Bratkovski et al. |
| 2008/0157127 A1 | 7/2008 | Bertin et al. |
| 2008/0173975 A1 | 7/2008 | Chen et al. |
| 2008/0278989 A1 | 11/2008 | Lee et al. |
| 2008/0293196 A1 | 11/2008 | Rinerson et al. |
| 2009/0027976 A1 | 1/2009 | Brewer et al. |
| 2009/0045390 A1 | 2/2009 | Rinerson et al. |
| 2009/0154232 A1 | 6/2009 | Norman |
| 2009/0225582 A1 | 9/2009 | Schloss |
| 2009/0302315 A1 | 12/2009 | Lee et al. |
| 2009/0303772 A1 | 12/2009 | Rinerson et al. |
| 2009/0303773 A1 | 12/2009 | Rinerson et al. |
| 2010/0044666 A1 | 2/2010 | Baek et al. |
| 2010/0067279 A1 | 3/2010 | Choi |
| 2010/0073990 A1 | 3/2010 | Siau et al. |
| 2010/0078759 A1 | 4/2010 | Sekar et al. |
| 2010/0103724 A1 | 4/2010 | Kim et al. |
| 2010/0110771 A1 | 5/2010 | Choi |
| 2010/0134239 A1 | 6/2010 | Wu et al. |
| 2010/0155686 A1 | 6/2010 | Bratkovski et al. |
| 2010/0155722 A1 | 6/2010 | Meyer |
| 2010/0155953 A1 | 6/2010 | Bornstein |
| 2010/0157657 A1 | 6/2010 | Rinerson et al. |
| 2010/0157658 A1 | 6/2010 | Schloss et al. |
| 2010/0159641 A1 | 6/2010 | Rinerson et al. |
| 2010/0159688 A1 | 6/2010 | Rinerson et al. |
| 2010/0161888 A1 | 6/2010 | Eggleston |
| 2010/0161918 A1 | 6/2010 | Norman |
| 2010/0195393 A1 | 8/2010 | Eggleston |
| 2010/0202188 A1 | 8/2010 | Rinerson et al. |
| 2010/0271885 A1 | 10/2010 | Scheuerlein et al. |
| 2010/0278479 A1 | 11/2010 | Bratkovski et al. |
| 2010/0290294 A1 | 11/2010 | Siau |
| 2011/0006275 A1 | 1/2011 | Roelofs et al. |
| 2011/0017977 A1 | 1/2011 | Bratkovski et al. |
| 2011/0024710 A1 | 2/2011 | Bratkovski et al. |
| 2011/0024716 A1 | 2/2011 | Bratkovski et al. |
| 2011/0059576 A1 | 3/2011 | Cho et al. |
| 2011/0182103 A1 | 7/2011 | Smythe et al. |
| 2011/0186803 A1 | 8/2011 | Rinerson et al. |
| 2011/0188281 A1 | 8/2011 | Siau et al. |
| 2011/0188282 A1 | 8/2011 | Chevallier et al. |
| 2011/0188283 A1 | 8/2011 | Chevallier et al. |
| 2011/0188284 A1 | 8/2011 | Chevallier et al. |
| 2011/0297927 A1 | 12/2011 | Ramaswamy et al. |
| 2012/0012897 A1 | 1/2012 | Besser et al. |
| 2012/0033481 A1 | 2/2012 | Rinerson et al. |
| 2012/0064691 A1 | 3/2012 | Rinerson et al. |
| 2012/0087174 A1 | 4/2012 | Rinerson et al. |
| 2012/0147678 A1 | 6/2012 | Norman |

(56) References Cited

U.S. PATENT DOCUMENTS

| | | |
|---|---|---|
| 2013/0043452 A1 | 2/2013 | Meyer et al. |
| 2013/0082228 A1 | 4/2013 | Parrillo et al. |
| 2013/0082232 A1 | 4/2013 | Wu et al. |

FOREIGN PATENT DOCUMENTS

| | | |
|---|---|---|
| JP | 2004-193595 A | 7/2004 |
| JP | 2005-203733 A | 7/2005 |
| WO | 00/48196 A1 | 8/2000 |
| WO | 03/079463 A2 | 9/2003 |
| WO | 2005/117021 A1 | 12/2005 |

OTHER PUBLICATIONS

Rinerson, Darrell, U.S. Appl. No. 12/286,723, filed Oct. 1, 2008, Office Action dated Jun. 26, 2009. 9 pages.

Rinerson, Darrell, U.S. Appl. No. 12/286,723, filed Oct. 1, 2008, Response dated Jul. 30, 2009 to the office Action dated Jun. 26, 2009. 8 pages.

Rinerson, Darrell, U.S. Appl. No. 12/653,486, filed Dec. 14, 2009, Notice of Allowance and Fee(s) Due dated Dec. 30, 2010. 12 pages.

Rinerson, Darrell, U.S. Appl. No. 12/653,486, filed Dec. 14, 2009, Notice to File Corrected Application Papers dated Feb. 23, 2010. 2 pages.

Rinerson, Darrell, U.S. Appl. No. 12/653,486, filed Dec. 14, 2009, Reply dated Feb. 25, 2010 to the Notice to File Corrected Application Papers dated Feb. 23, 2010. 7 pages.

Rossell, et al., "Electrical Current Distribution Across a Metal-Insulator-Metal Structure During Bistable Switching," Journal of Applied Physics, vol. 90, No. 6, Sep. 15, 2001, pp. 2892-2898. 7 pages.

Sawa et al., "Hysteretic Current-Voltage Characteristics and Resistance Switching at a rectifying $Ti/Pr0.7Ca0.3MnO3$ Interface," Applied Physics Letters, vol. 85, No. 18, Nov. 1, 2004, pp. 4073-4075. 3 pages.

Simmons et al., "New Conduction and Reversible Memory Phenomena in Thin Insulating Films," Proceedings of the Royal Society of London, vol. 301, No. 1464, Oct. 3, 1967, pp. 77-102. 28 pages.

Steele, B.C.H., et al., "Materials for Fuel-Cell Technologies," Nature 414, Nov. 2001, pp. 345-352, 9 pages.

Stetter, J.R., et al., "Sensors, Chemical Sensors, Electrochemical Sensors, and ECS", Journal of the Electrochemical Society, 150 (2), S11-S16 (2003). 6 pages.

Thurstans et al., "The Electroformed Metal-Insulator-Metal Structure: A Comprehensive Model," Journal of Physics D: Applied Physics, J. Phys. D: Appl. Phys. 35 (2002), Apr. 2, 2002, pp. 802-809. 8 pages.

Watanabe et al., "Current-Driven Insulator-Conductor Transition and Nonvolatile Memory in Chromium-Doped $SrTiO3$ Single Crystals," Applied Physics Letters, vol. 78, No. 23, Jun. 4, 2001, pp. 3738-3740. 3 pages.

Zhao, Y.G., et al., "Effect of Oxygen Content on the Structural, Transport, and Magnetic Properties of La1—deltaMn1—deltaO3 Thin Films," Journal of Applied Physics, vol. 86, No. 11, Dec. 1999, pp. 6327-6330.

Abelmann et al., "Self-Assembled Three-Dimensional Non-Volatile Memories", Micromachines, vol. 1, pp. 1-18, Jan. 18, 2010.

Baek et al., "Realization of Vertical Resistive Memory (VRRAM) Using Cost Effective 3D Process", IDEM 2011, 31, 8.1, pp. 737-740.

Chevallier et al., "A 0.13um 64Mb Multi-layered Conductive Metal-Oxide Memory", ISSC 2010/Session 14/Non-Volatile Memory/14.3, pp. 260-261.

Crowley et al., "16.4: 512Mb PROM with 8 Layers of Antifuse/Diode Cells", 2003 IEEE ISSC, First Edition, pp. 284-285, Feb. 11, 2003.

Dong et al., "Si/a-Si Core/Shell Nanowires as Nonvolatile Crossbar Switches", Nano Letters 2008, vol. 8, No. 29, 6 pages.

Office Action dated Aug. 2, 2007, issued in related European Application No. 05794930.7 (4 pages).

Jang et al., "Vertical Cell Array Using TCAT (Terabit Cell Array Transistor) Technology for Ultra High Density 11 NAND Flash Memory", 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices", 2009 Symposium on VLSI Technology Digest of Technical Papers, pp. 136-137.

Kim et al., "Novel Vertical-Stacked-Array-Transistor (VSAT) for Ultra-High-Density and Cost-Effective NANO Flash Memory Devices and SSD (Solid State Drive)," 2009 Symposium on VLSI Technology Digest of Technical Papers, pp. 186-187.

Kim et al., "Multi-Layered Vertical Gate NANO Flash Overcoming Stacking Limit for Terabit Density Storage", 2009 VLSI Symposium on VLSI Technology Digest of Technical Papers, Jun. 16-18, 2009, pp. 188-189.

Krieger, Ju H., "Principle Operation of 3-D Memory Device Based on Piezoacousto Properties of Ferrolectric Films", In Tech, Dec. 2010, pp. 3-16.

Kwong et al., "Vertical Silicon Nanowire Platform for Low Power Electronics and Clean Energy Applications", May 25, 2011, Journal of Nanotechnology, vol. 2012, Article ID 492121, 21 pages.

Lee et al., "Near Edge X-ray Absorption Fine Structure Study of $Pr0.65Ca0.35MnO3$ Films," Phys. Stat sol (a) 196, No. 1, 2003, pp. 70-73.

Liu et al., "A New Concept for Non-Volatile Memory: The Electric-Pulse Induced Resistive Change Effect in Colossal Magnetoresistive Thin Films", Non-Volatile Memory Technology Symposium, Nov. 7, 2001, pp. 1-7.

Lue et al., "A Highly Scalable 8-Layer 30 Vertical-Gate (VG) TFT Nano Flash Using Junction-Free Buried Channel BE-SONOS Device", 2010 Symposium on VLSI Technology, Jun. 15-17, 2010, pp. 131-132.

Nian, Y.B., et al., "Evidence for an Oxygen Diffusion Model for the Electric Pulse Induced Resistance Change Effect in Oxides", Texas Center for Advance Materials, University of Houston (2006), 7 pages.

Ou et al., "Array Architecture for a Nonvolatile 3-Dimensional Cross-Point Memory", Doctoral Dissertation, Stanford University, Mar. 2010, pp. 1-119.

Ou et al., "Array Architecture for a Nonvolatile 3-Dimensional Cross-Point Resistance-Change Memory", IEEE Journal of Solid-State Circuits, vol. 46, No. 9, Sep. 2011, pp. 2158-2170.

PCT International Search Report and the Written Opinion dated Aug. 15, 2006, issued in related International Application No. PCT/US05/031913 (11 pages).

PCT International Preliminary Report on Patentability dated Aug. 28, 2007, issued in related International Application No. PCT/US05/031913 (5 pages).

Reller, A. et al., "Superstructures Formed by the Ordering of Vacancies in a Selective Oxidation Catalyst: Grossly Detective $CaMnO3$", Printed in Great Britain, Department of Physical Chemistry, University of Cambridge, Lensfield Road, Cambridge, CB2 1 EP, UK, vol. 194, Aug. 8, 1984, 1 page.

Strachan et al., "The Switching Location of a Bipolar Memristor: Chemical, Thermal and Structural Mapping", Nanotechnology 22 (2011) 254015, pp. 1-6.

Yoon et al., "Vertical Cross-point Resistance Change Memory for Ultra-High Density Non-volatile Memory Applications", 2009 Symposium on VLSI Technology Digest of Technical Papers, pp. 26-27.

Zhang et al., "A 3D RRAM Using Stackable 1 TXR Memory Cell for High Density Application", IEEE Xplore, Feb. 5, 2010, pp. 917-920.

Zhuang, W.W. et al., "Novell Colossal Magnetoresistive Thin Film Nonvolatile Resistance Random Access Memory (RRAM)"; IEDM Technical Digest, IEEE, Dec. 8, 2002, pp. 193-196.

Baikalov et al., "Field-Driven Hysteretic and Reversible Resistive Switch at the $Ag—Pr0.7Ca0.3MnO3$ interface," Applied Physics Letters, vol. 83, No. 5, Aug. 4, 2003, pp. 957-959. 3 pages.

(56) References Cited

OTHER PUBLICATIONS

Beck et al., "Reproducible Switching Effect in Thin Oxide Films for Memory Applications," Applied Physics Letters, vol. 77, No. 1, Jul. 3, 2000, pp. 139-141. 3 pages.
Chemical Elements.com, "Periodic Table: Transition Metals", 1996, downloaded Mar. 19, 2017 from http://www.chemicalelements.com/groups/transition.html. 2 pages.
Lai et al., "OUM—A 180 nm Nonvolatile Memory Cell Element Technology for Stand Alone and Embedded Applications," IEEE International Electron Device Meeting, Technical Digest, 2001. 4 pages.
Liu et al., "Electric-Pulse-Induced Reversible Resistance Change Effect in Magnetoresistive Films," Applied Physics Letters, vol. 76, No. 19, May 8, 2000, pp. 2749-2751. 3 pages.
Millis, A.J., "Cooperative Jahn-Teller Effect and Electron-Phonon Coupling in La1—xAxMnO3", Phys. Rev. B 53 8434-8441 (1996). 8 pages.
Mizusaki, J., et al., "Electronic Conductivity, Seebeck Coefficient, Defect and Electronic Structure of Nonstoichiometric La1—xSRxMnO3", Solid State Ionics 132, pp. 167-180 (2000). 14 pages.
Oligschlaeger, R., et al., "Resistive Switching and Data Reliability of Epitaxial (Ba,Sr)TiO Thin Films", Applied Physics Letters, 88 (2006), 042901. 3 pages.
Oxley, David, "Chapter 4: Memory Effects in Oxide Films," pp. 251-325 in Oxides and Oxide Films, vol. 6, 1981, edited by Ashok K. Vijh. 39 pages.
Reller et al., Superstructures Formed by the Ordering of Vacancies in a Selective Oxidation Catalyst: Grossly Defective CaMnO3, Proceedings of the Royal Society of London, vol. 394, No. 1807, Aug. 1984, pp. 223-241, 26 pages.
Rinerson, Darrell, U.S. Appl. No. 10/773,549, filed Feb. 6, 2004, Notice of Allowance and Fee(s) Due dated Mar. 7, 2006. 10 pages.
Rinerson, Darrell, U.S. Appl. No. 10/773,549, filed Feb. 6, 2004, Office Action dated Nov. 29, 2005. 16 pages.
Rinerson, Darrell, U.S. Appl. No. 10/773,549, filed Feb. 6, 2004, Office Action dated May 4, 2005 re Restriction Requirement. 6 pages.
Rinerson, Darrell, U.S. Appl. No. 10/773,549, filed Feb. 6, 2004, Office Action dated Aug. 24, 2005 re Restriction Requirement. 7 pages.
Rinerson, Darrell, U.S. Appl. No. 10/773,549, filed Feb. 6, 2004, Proposal submitted Feb. 1, 2006 for Amending Drawing(s) in Response to Office Action dated Nov. 29, 2005. 11 pages.
Rinerson, Darrell, U.S. Appl. No. 10/773,549, filed Feb. 6, 2004, Response dated Feb. 23, 2006 to the Office Action dated Nov. 29, 2006. 16 pages.
Rinerson, Darrell, U.S. Appl. No. 10/773,549, filed Feb. 6, 2004, Response dated Jun. 6, 2005 to the Restriction Requirement dated May 4, 2005. 3 pages.
Rinerson, Darrell, U.S. Appl. No. 10/773,549, filed Feb. 6, 2004, Response dated Sep. 9, 2005 to the Restriction Requirement dated Aug. 24, 2005. 5 pages.
Rinerson, Darrell, U.S. Appl. No. 11/473,005, filed Jun. 22, 2006, Notice of Allowance and Fee(s) Due dated Sep. 24, 2007. 13 pages.
Rinerson, Darrell, U.S. Appl. No. 11/473,005, filed Jun. 22, 2006, Office Action dated Aug. 23, 2007. 7 pages.
Rinerson, Darrell, U.S. Appl. No. 11/473,005, filed Jun. 22, 2006, Preliminary Amendment dated Jul. 25, 2006. 9 pages.
Rinerson, Darrell, U.S. Appl. No. 11/473,005, filed Jun. 22, 2006, Response dated Sep. 5, 2007 to the Office Action dated Aug. 23, 2007. 10 pages.
Rinerson, Darrell, U.S. Appl. No. 12/215,958, filed Jun. 30, 2008, Notice of Allowance and Fee(s) Due dated Oct. 11, 2011. 14 pages.
Rinerson, Darrell, U.S. Appl. No. 12/215,958, filed Jun. 30, 2008, Office Action dated Jul. 25, 2011 re Restriction Requirement. 6 pages.
Rinerson, Darrell, U.S. Appl. No. 12/215,958, filed Jun. 30, 2008, Response dated Jul. 27, 2011 to the Requirement for Restriction dated Jul. 25, 2011. 10 pages.
Viktor V. Poltavets, "Charge transfer, hybridization and local inhomogeneity effects in NaxCoO2*yH2O", Phys. Rev. B 74 (2006), pp. 1-4.
Gloria Subias et al., "Mn local structure effects in charge-ordered mixed-valence RE1-xCaxMnO3 (RE:La, Tb) perovskites: a review of the experimental situation", Journal of Physics: Condensed Matter, Issue 19, May 20, 2002, Abstract.
Hisao Yamauchi et al., "Control of mixed valence state to yield novel functions in double-perovskite iron-copper oxides", Science Links Japan, Nippon Sheet Glass Foundation for Materials Science and Engineering Report, 2003, Abstract.
First Search dated Jan. 11, 2009, issued in related Chinese Application No. 200580038024.5 (1 page).
Supplementary Search dated Mar. 29, 2010, issued in related Chinese Application No. 200580038024.5 (1 page).
Supplementary Search dated Mar. 2, 2011, issued in related Chinese Application No. 200580038024.5 (1 page).
First Office Action dated Jan. 6, 2014, issued in related Chinese Application No. 201210193421.1, with English machine translation (7 pages).
Examination Report dated Jan. 25, 2010, issued in related European Application No. 05794930.7 (3 pages).
Extended European Search Report dated May 25, 2011, issued in related European Application No. 10182254.2 (5 pages).
Examination Report dated Dec. 13, 2013, issued in related European Application No. 10182254.2 (3 pages).
Notice of Reasons for Refusal dated Feb. 7, 2012, issued in related Japanese Application No. 2007-530487, with English machine translation (6 pages).
Final Notification of Reasons for Refusal dated Jan. 8, 2013, issued in related Japanese Application No. 2007-530487, with English machine translation (6 pages).
Decision of Refusal dated Aug. 13, 2013, issued in related Japanese Application No. 2007-530487, with English machine translation (2 pages).
Notification of Reason for Refusal dated Dec. 5, 2011, issued in related Korean Application No. 10-2007-7005463, with English machine translation (8 pages).
Grant of Patent dated Nov. 6, 2012, issued in related Korean Application No. 10-2007-7005463, with English machine translation (4 pages).
Non-Final Office Action dated Feb. 1, 2007, issued in related U.S. Appl. No. 10/934,951 (19 pages).
Non-Final Office Action dated Jan. 7, 2008, issued in related U.S. Appl. No. 11/095,026 (7 pages).
Final Office Action dated May 5, 2009, issued in related U.S. Appl. No. 11/095,026 (6 pages).
Notice of Allowance dated Sep. 24, 2007, issued in related U.S. Appl. No. 11/473,005 (8 pages).
Non-Final Office Action dated Mar. 23, 2009, issued in related U.S. Appl. No. 11/681,992 (5 pages).
Notice of Allowance dated Nov. 20, 2009, issued in related U.S. Appl. No. 11/681,992 (7 pages).
Notice of Allowance dated Oct. 11, 2011, issued in related U.S. Appl. No. 12/215,958 (10 pages).
Non-Final Office Action dated Jun. 26, 2009, issued in related U.S. Appl. No. 12/286,723 (8 pages).
Non-Final Office Action dated Jan. 11, 2011, issued in related U.S. Appl. No. 12/456,627 (6 pages).
Final Office Action dated Jun. 1, 2011, issued in related U.S. Appl. No. 12/456,627 (5 pages).
Non-Final Office Action dated Aug. 21, 2013, issued in related U.S. Appl. No. 12/456,627 (7 pages).
Non-Final Office Action dated Mar. 12, 2014, issued in related U.S. Appl. No. 12/456,627 (9 pages).
Non-Final Office Action dated Jan. 14, 2011, issued in related U.S. Application No. 12/456,677 (6 pages).
Final Office Action dated Jun. 2, 2011, issued in related U.S. Appl. No. 12/456,677 (5 pages).
Notice of Allowance dated Dec. 30, 2010, issued in related U.S. Appl. No. 12/653,486 (9 pages).
Notice of Allowance dated Oct. 17, 2012, issued in related U.S. Appl. No. 12/931,967 (6 pages).

(56) References Cited

OTHER PUBLICATIONS

Notice of Allowance dated Oct. 28, 2013, issued in related U.S. Appl. No. 13/272,985 (10 pages).
Notice of Allowance dated Sep. 5, 2013, issued in related U.S. Appl. No. 13/301,490 (10 pages).
Non-Final Office Action dated Sep. 6, 2012, issued in related U.S. Appl. No. 13/329,063 (9 pages).
Notice of Allowance dated Jun. 10, 2015, issued in related U.S. Appl. No. 14/167,694 (10 pages).
Notice of Allowance dated Jun. 15, 2015, issued in related U.S. Appl. No. 14/463,518 (9 pages).
Non-Final Office Action dated Jun. 30, 2016, issued in related U.S. Appl. No. 14/850,702 (6 pages).
Non-Final Office Action dated Feb. 2, 2016, issued in related U.S. Appl. No. 14/844,805 (11 pages).
Final Office Action dated Jun. 3, 2016, issued in related U.S. Appl. No. 14/844,805 (14 pages).
Non-Final Office Action dated Oct. 6, 2016, issued in related U.S. Appl. No. 14/844,805 (15 pages).
Final Office Action dated Feb. 7, 2017, issued in related U.S. Appl. No. 14/844,805 (15 pages).
Non-Final Office Action dated Mar. 23, 2017, issued in related U.S. Appl. No. 15/393,545 (11 pages).
Non-Final Office Action dated Jun. 11, 2018, issued in related U.S. Appl. No. 15/797,452 (10 pages).
Notice of Allowance dated Oct. 10, 2017, issued in related U.S. Appl. No. 14/844,805 (7 pages).
Non-Final Office Action dated Oct. 18, 2018, issued in related U.S. Appl. No. 15/797,716 (10 pages).
Non-Final Office Action dated Oct. 7, 2019, issued in related U.S. Appl. No. 16/262,841 (9 pages).
Notice of Allowance dated Feb. 6, 2020, issued in related U.S. Appl. No. 16/262,841 (8 pages).
Non-Final Office Action dated Feb. 10, 2020, issued in related U.S. Appl. No. 16/412,015 (10 pages).
Non-Final Office Action dated Sep. 3, 2020, issued in related U.S. Appl. No. 16/864,051 (24 pages).
Notice of Allowance dated Dec. 7, 2020, issued in related U.S. Appl. No. 16/864,051 (8 pages).
Notice of Allowance dated Mar. 30, 2021, issued in related U.S. Appl. No. 16/864,051 (8 pages).

* cited by examiner

MEMORY ELEMENT WITH A REACTIVE METAL LAYER

CROSS REFERENCE TO RELATED APPLICATIONS

This application is a continuation of U.S. patent application Ser. No. 16/412,015, filed May 14, 2019, which is a continuation of U.S. patent application Ser. No. 15/797,716, filed Oct. 30, 2017, which issued on Jul. 2, 2019 as U.S. Pat. No. 10,340,312, which is a continuation of U.S. patent application Ser. No. 15/393,545, filed Dec. 29, 2016, which issued on Oct. 31, 2017 as U.S. Pat. No. 9,806,130, which is a continuation of U.S. patent application Ser. No. 14/850,702, filed Sep. 10, 2015, which issued on Feb. 14, 2017 as U.S. Pat. No. 9,570,515, which is a continuation of U.S. patent application Ser. No. 14/167,694, filed Jan. 29, 2014, which issued on Oct. 13, 2015 as U.S. Pat. No. 9,159,408, which is a continuation of U.S. patent application Ser. No. 13/272,985, filed Oct. 13, 2011, which issued on Mar. 18, 2014 as U.S. Pat. No. 8,675,389, which is a continuation of U.S. patent application Ser. No. 12/931,967, filed Feb. 15, 2011, now abandoned, which is a continuation of U.S. patent application Ser. No. 12/653,486, filed Dec. 14, 2009, which issued on Feb. 15, 2011 as U.S. Pat. No. 7,889,539, which is a continuation of U.S. patent application Ser. No. 12/286,723, filed Oct. 1, 2008, which issued on Dec. 15, 2009 as U.S. Pat. No. 7,633,790, which is a continuation of Ser. No. 12/215,958, filed Jun. 30, 2008, which issued on Nov. 22, 2011, as U.S. Pat. No. 8,062,942, which is a divisional of Ser. No. 11/473,005 filed Jun. 22, 2006, which issued on Jul. 1, 2008 as U.S. Pat. No. 7,394,679, which is a continuation of Ser. No. 10/773,549, filed Feb. 6, 2004, which issued on Jul. 25, 2006 as U.S. Pat. No. 7,082,052. The above-referenced applications are hereby incorporated by reference in their entirety.

FIELD OF THE INVENTION

The present invention relates generally to computer memory, and more specifically to memory fabrication.

DESCRIPTION OF THE RELATED ART

Memory can either be classified as volatile or nonvolatile. Volatile memory is memory that loses its contents when the power is turned off. In contrast, non-volatile memory does not require a continuous power supply to retain information. Most non-volatile memories use solid-state memory devices as memory elements.

Certain conductive metal oxides (CMOs), for example, can be used as solid-state memory devices. The CMOs can retain a resistive state after being exposed to an electronic pulse, which can be delivered through two terminals. U.S. Pat. No. 6,204,139, issued Mar. 20, 2001 to Liu et al., incorporated herein by reference for all purposes, describes some perovskite materials that exhibit such characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes. However, the materials described in the U.S. Pat. No. 6,204,139 patent are not generally applicable to RAM memory because the resistance of the material, when scaled to small dimensions, is considered to be too large to make a memory with fast access times.

In U.S. Pat. No. 6,531,371 entitled "Electrically programmable resistance cross point memory" by Hsu et al, incorporated herein by reference for all purposes, resistive cross point memory devices are disclosed along with methods of manufacture and use. The memory device comprises an active layer of perovskite material interposed between upper electrodes and lower electrodes.

Similarly, the IBM Zurich Research Center has also published three technical papers that discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and nonvolatile memory in chromium-doped $SrTiO_3$ single crystals," Applied Physics Letters, Vol. 78, No. 23, 4 Jun. 2001, and "Electric current distribution across a metal-insulator-metal structure during bistable switching," Journal of Applied Physics, Vol. 90, No. 6, 15 Sep. 2001, all of which are hereby incorporated by reference for all purposes.

The discovery of the resistance-changing property of certain CMOs, however, is relatively recent and has not yet been implemented in a commercial memory product. There are continuing efforts to bring a true non-volatile RAM (nvRAM) to market.

SUMMARY OF THE INVENTION

The present invention generally provides a multi-resistive state element that is created by treating a conductive element. One embodiment is a memory array that includes a plurality of two-terminal memory plugs. Each two-terminal memory plug is operable to change from a high resistive state to a low resistive state upon application of a first write voltage and change from a low resistive state to a high resistive state upon application of a second write voltage. Furthermore, each two terminal memory plug includes a multi-resistive state element that has a conductive element and a reactive metal that reacts with the conductive element.

In yet another embodiment of the invention, the multi-resistive state element has a conductive element and a very thin layer of material that is less than 200 Å thick deposited on the conductive element.

In some embodiments of the invention, the conductive element is a conductive metal oxide and either the reactive metal or the very thin layer of material is Al, Ti, Mg, W, Fe, Cr, V, Zn, Ta or Mo. In other embodiments of the invention, the memory plug includes a top electrode and a bottom electrode. In yet other embodiments of the invention, the top electrode is Pt.

BRIEF DESCRIPTION OF THE DRAWINGS

The invention may best be understood by reference to the following description taken in conjunction with the accompanying drawings, in which.

It is to be understood that, in the drawings, like reference numerals designate like structural elements. Also, it is understood that the depictions in the FIGS. are not necessarily to scale.

DETAILED DESCRIPTION

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

The Memory Array

Conventional nonvolatile memory requires three terminal MOSFET-based devices. The layout of such devices is not ideal, usually requiring an area of at least $8f^2$ for each memory cell, where f is the minimum feature size. However, not all memory elements require three terminals. If, for example, a memory element is capable of changing its electrical properties (e.g., resistivity) in response to a voltage pulse, only two terminals are required. With only two terminals, a cross point array layout that allows a single cell to be fabricated to a size of $4f^2$ can be utilized. U.S. patent application, "Cross Point Memory Array Using Multiple Thin Films," U.S. application Ser. No. 10/330,512, filed Dec. 26, 2002, now issued U.S. Pat. No. 6,753,561, incorporated herein by reference in its entirety and for all purposes, describes such a device.

Figure 1A:
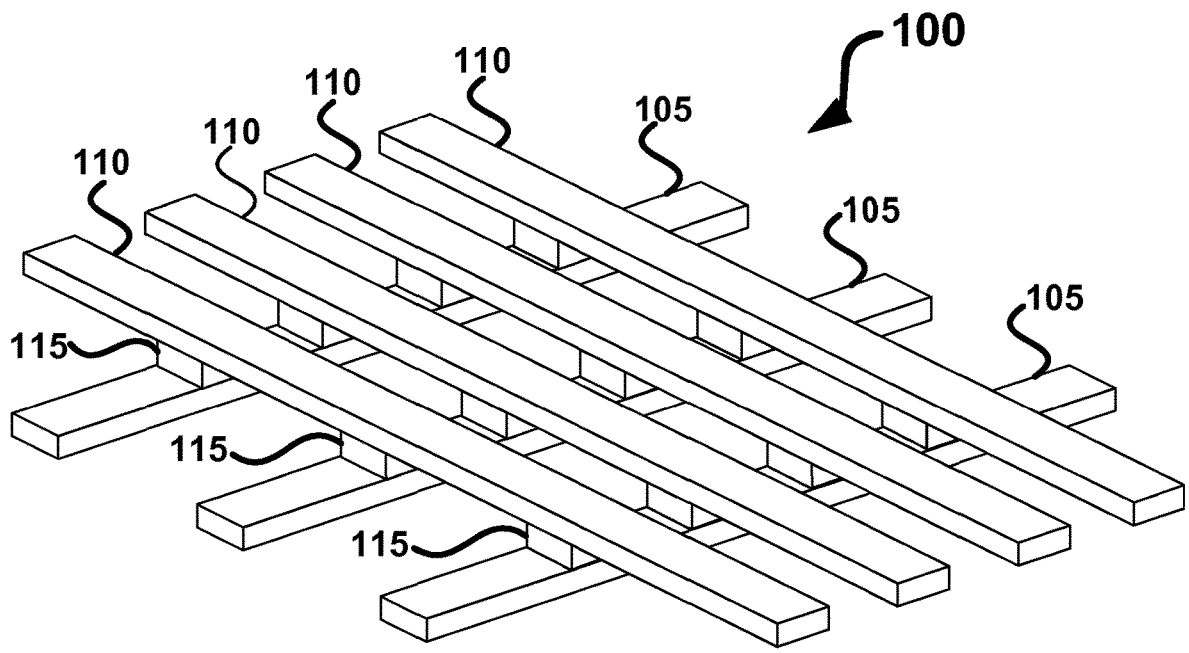
FIG. 1A depicts a perspective view of an exemplary cross point memory array employing a single layer of memory.

FIG. 1A depicts a perspective view of an exemplary cross point memory array 100 employing a single layer of memory. A bottom layer of x-direction conductive array lines 105 is orthogonal to a top layer of y-direction conductive array lines 110. The x-direction conductive array lines 105 act as a first terminal and the y-direction conductive array lines 110 act as a second terminal to a plurality of memory plugs 115, which are located at the intersections of the conductive array lines 105 and 110. The conductive array lines 105 and 110 are used to both deliver a voltage pulse to the memory plugs 115 and carry current through the memory plugs 115 in order to determine their resistive states.

Conductive array line layers 105 and 110 can generally be constructed of any conductive material, such as aluminum, copper, tungsten or certain ceramics. Depending upon the material, a conductive array line would typically cross between 64 and 8192 perpendicular conductive array lines. Fabrication techniques, feature size and resistivity of material may allow for shorter or longer lines. Although the x-direction and y-direction conductive array lines can be of equal lengths (forming a square cross point array) they can also be of unequal lengths (forming a rectangular cross point array).

Figure 2A:
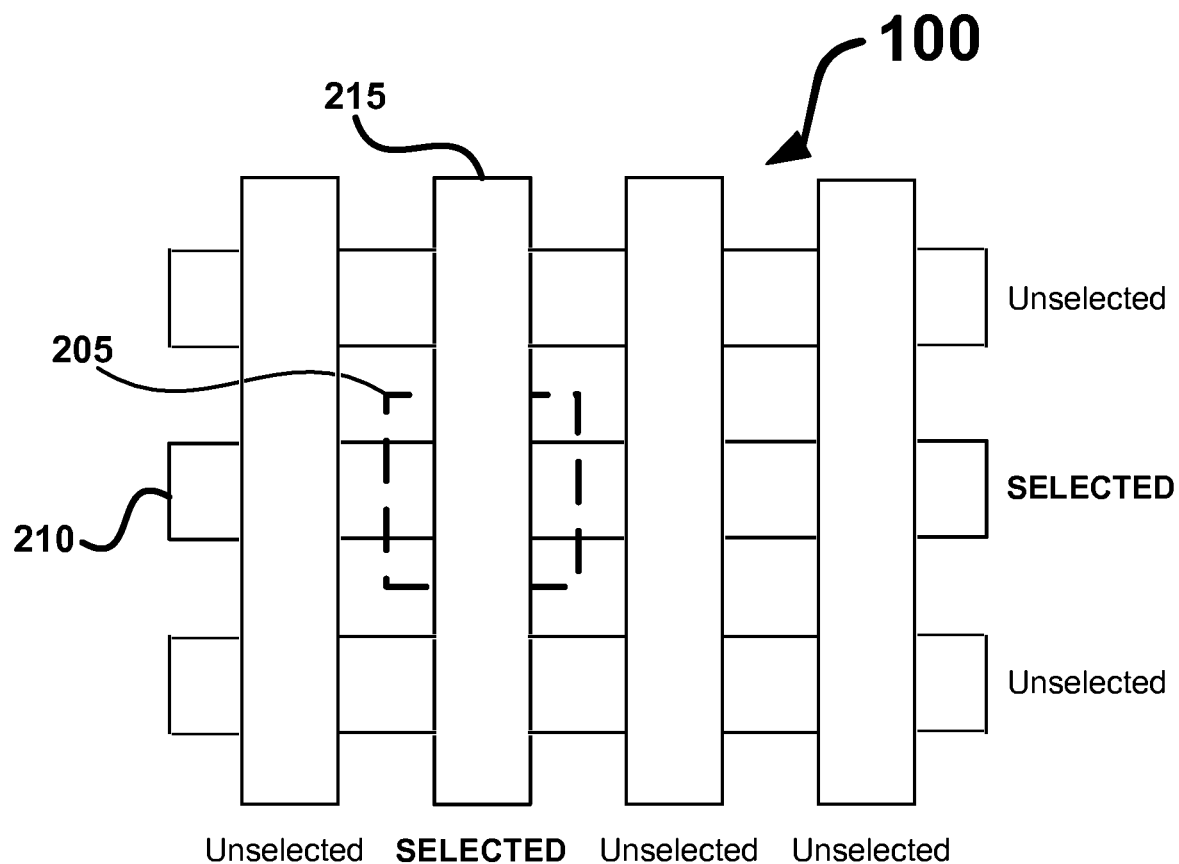
FIG. 2A depicts a plan view of selection of a memory cell in the cross point array depicted in FIG. 1A.
Figure 2B:
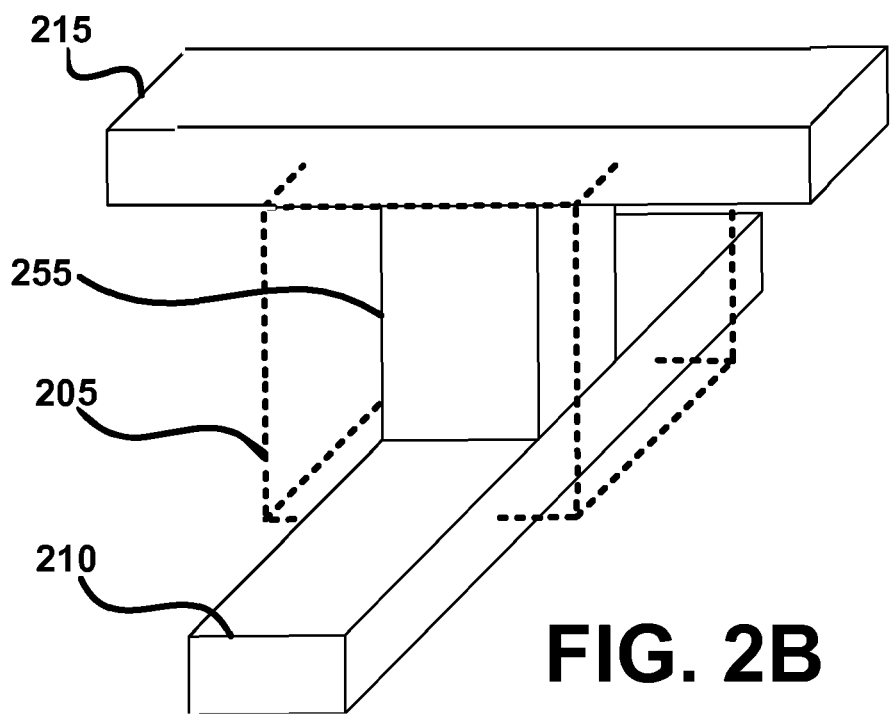
FIG. 2B depicts a perspective view of the boundaries of the selected memory cell depicted in FIG. 2A.

FIG. 2A illustrates selection of a memory cell 205 in the cross point array 100. The point of intersection between a single x-direction conductive array line 210 and a single y-direction conductive array line 215 uniquely identifies the single memory cell 205. FIG. 2B illustrates the boundaries of the selected memory cell 205. The memory cell is a repeatable unit that can be theoretically extended in one, two or even three dimensions. One method of repeating the memory cells in the z-direction (orthogonal to the x-y plane) is to use both the bottom and top surfaces of conductive array lines 105 and 110.

Figure 1B:
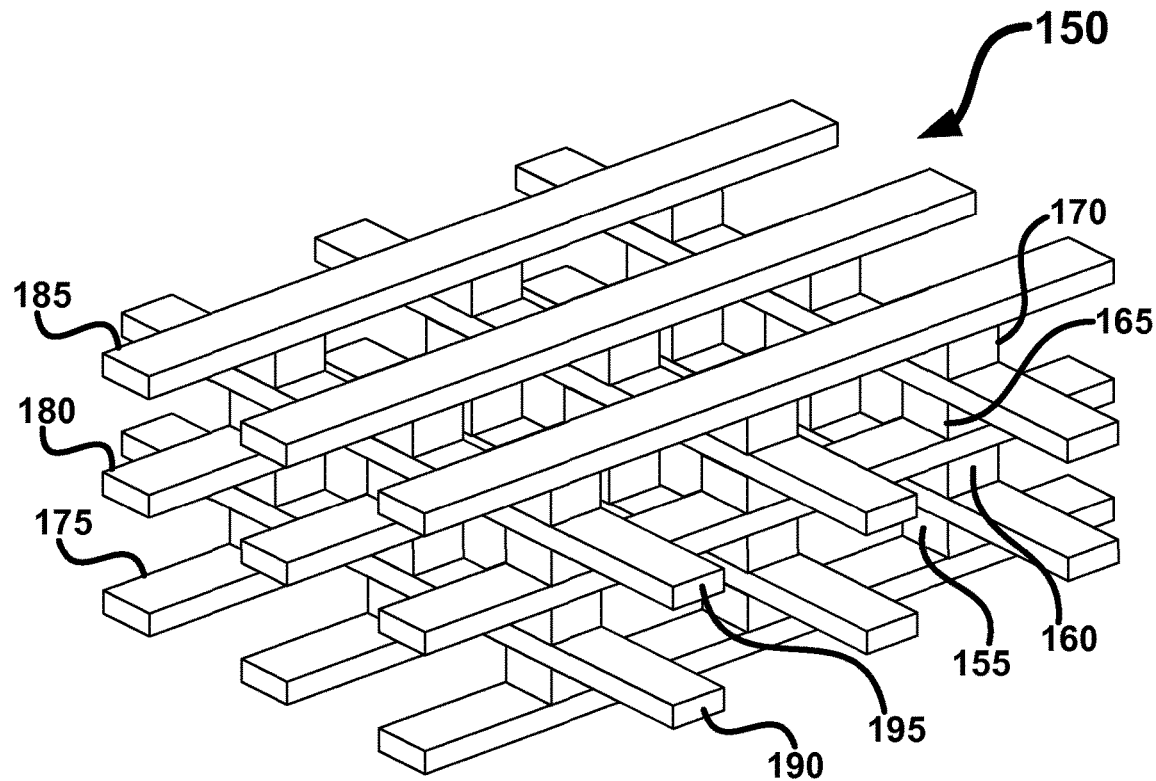
FIG. 1B depicts a perspective view of an exemplary stacked cross point memory array employing four layer of memory.

FIG. 1B depicts an exemplary stacked cross point array 150 employing four memory layers 155, 160, 165, and 170. The memory layers are sandwiched between alternating layers of x-direction conductive array lines 175, 180 and 185 and y-direction conductive array lines 190 and 195 such that each memory layer 155, 160, 165, and 170 is associated with only one x-direction conductive array line layer and one y-direction conductive array line layer. Although the top conductive array line layer 185 and bottom conductive array line layer 175 are only used to supply voltage to a single memory layer 155 and 170, the other conductive array line layers 180, 190, and 195 can be used to supply voltage to both a top and a bottom memory layer 155, 160, 165, or 170. U.S. patent application, "Re-Writable Memory With Multiple Memory Layers," U.S. application Ser. No. 10/612,191, filed Jul. 1, 2003, now issued U.S. Pat. No. 6,906,939, incorporated herein by reference in its entirety for all purposes, describes stacked cross point arrays.

Referring back to FIG. 2B, the repeatable cell that makes up the cross point array 100 can be considered to be a memory plug 255, plus ½ of the space around the memory plug, plus ½ of an x-direction conductive array line 210 and ½ of a y-direction conductive array line 215. Of course, ½ of a conductive array line is merely a theoretical construct, since a conductive array line would generally be fabricated to the same width, regardless of whether one or both surfaces of the conductive array line was used. Accordingly, the very top and very bottom layers of conductive array lines (which use only one surface) would typically be fabricated to the same size as all other layers of conductive array lines.

Figure 6A:
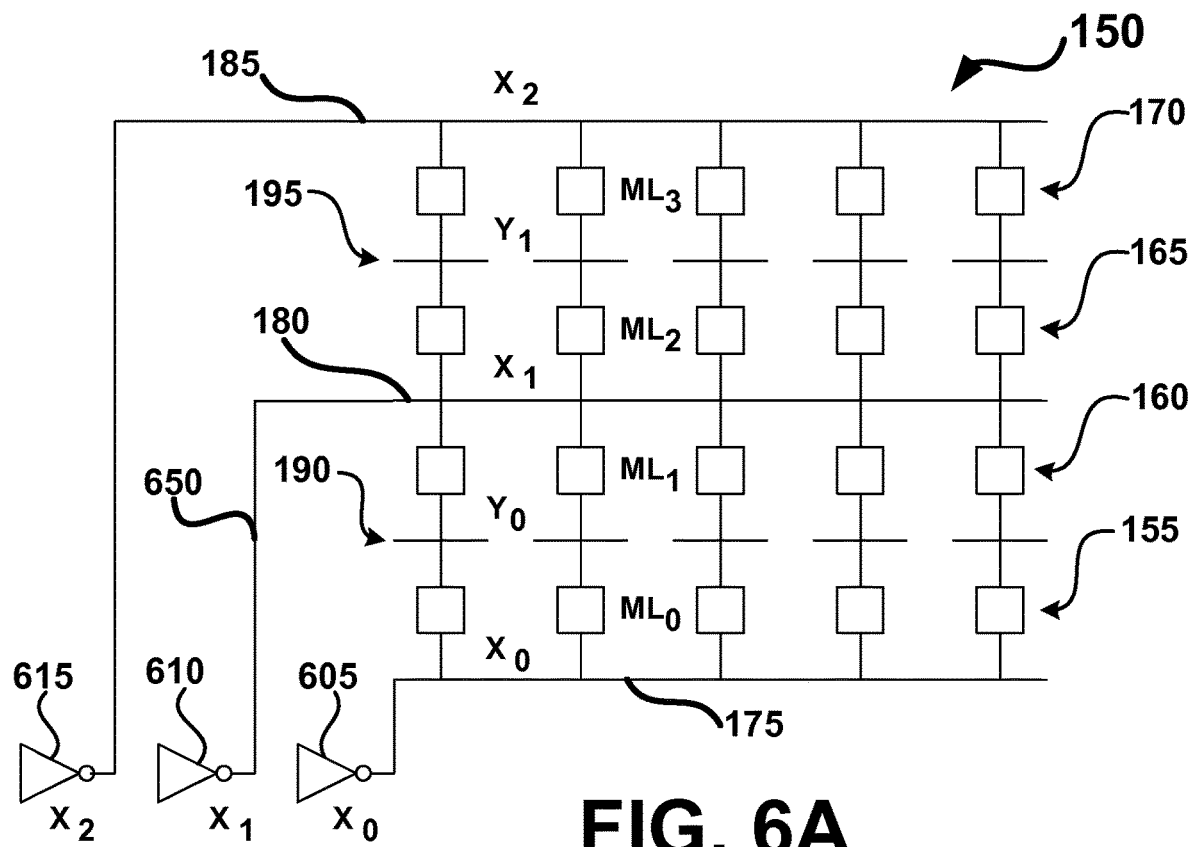
FIG. 6A depicts a schematic diagram of x-direction driver sets.

One benefit of the cross point array is that the active circuitry that drives the cross point array 100 or 150 can be placed beneath the cross point array, therefore reducing the footprint required on a semiconductor substrate. U.S. patent application, "Layout Of Driver Sets In A Cross Point Memory Array," U.S. application Ser. No. 10/612,733, filed Jul. 1, 2003, now issued U.S. Pat. No. 7,079,442, incorporated herein by reference in its entirety for all purposes, describes various circuitry that can achieve a small footprint underneath both a single layer cross point array 100 and a stacked cross point array 150. Further details of the peripheral circuitry are described in U.S. patent application, "An Adaptive Programming Technique for a Re-Writeable Conductive Memory Device," U.S. application Ser. No. 10/680,508, filed Oct. 6, 2003, now issued U.S. Pat. No. 6,940,744, incorporated herein by reference in its entirety for all purposes. FIG. 6A depicts x-direction driver sets 605, 610, and 615 that are used to select specific x-direction conductive array lines in a $X_0$ layer 175, $X_1$ layer 180, and $X_2$ layer 185.

Figure 6B:
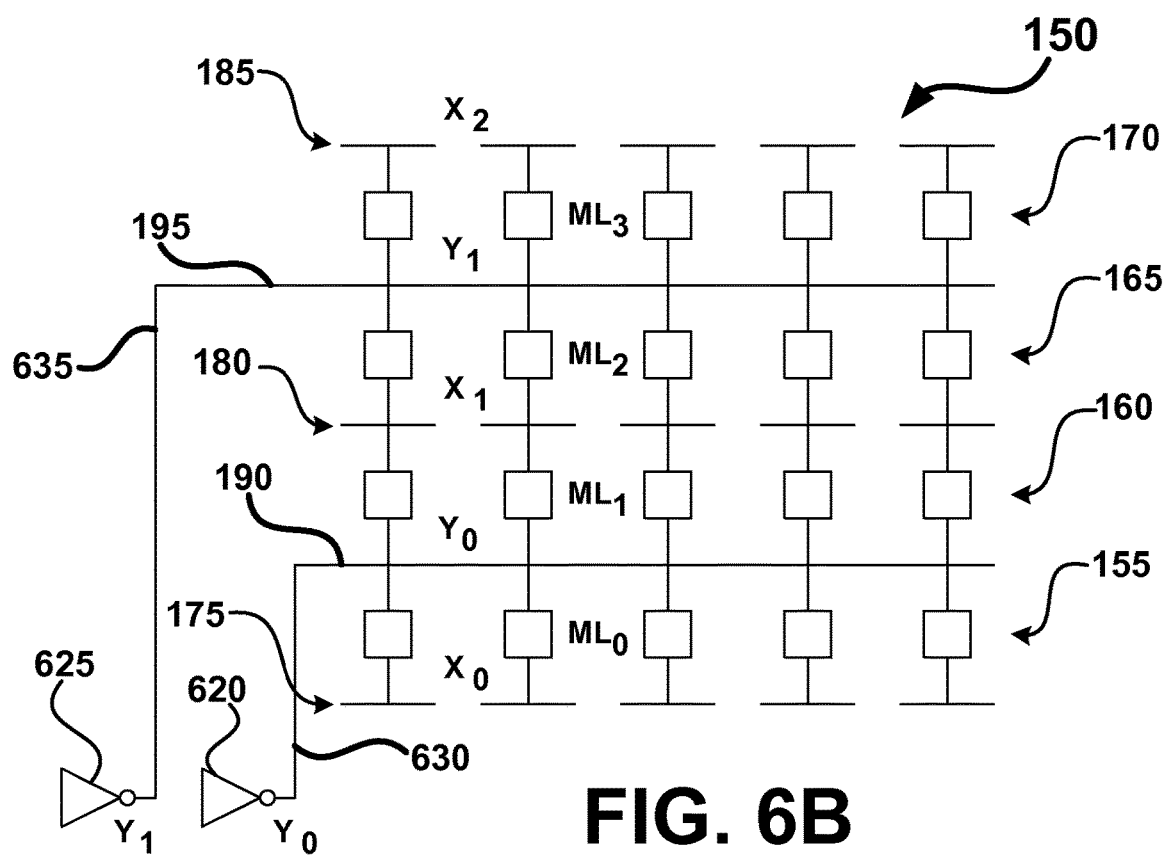
FIG. 6B depicts a schematic diagram of y-direction driver sets.

Although the $X_0$ driver 605 and the $X_2$ driver 615 can use identical logic, separate drivers are shown because of the difficulty in routing the single $X_0$ driver 605 around a thru 650 that connects the $X_1$ layer 180 to the $X_1$ driver 610. FIG. 6B depicts y-direction driver sets 620 and 625 that are used to select specific y-direction conductive array lines in the y-direction conductive array line layers 190 and 195. The $Y_0$ driver set 620 uses a thru 630 that goes through one ILD layer in order to connect with the $Y_0$ layer 190. The $Y_1$ driver set 625 uses a thru 635 that goes through three ILD layers in order to connect with the $Y_1$ layer 195.

The cross point array is not the only type of memory array that can be used with a two-terminal memory element. For example, a two-dimensional transistor memory array can incorporate a two-terminal memory element. While the memory element in such an array would be a two-terminal device, the entire memory cell would be a three-terminal device.

Figure 3:
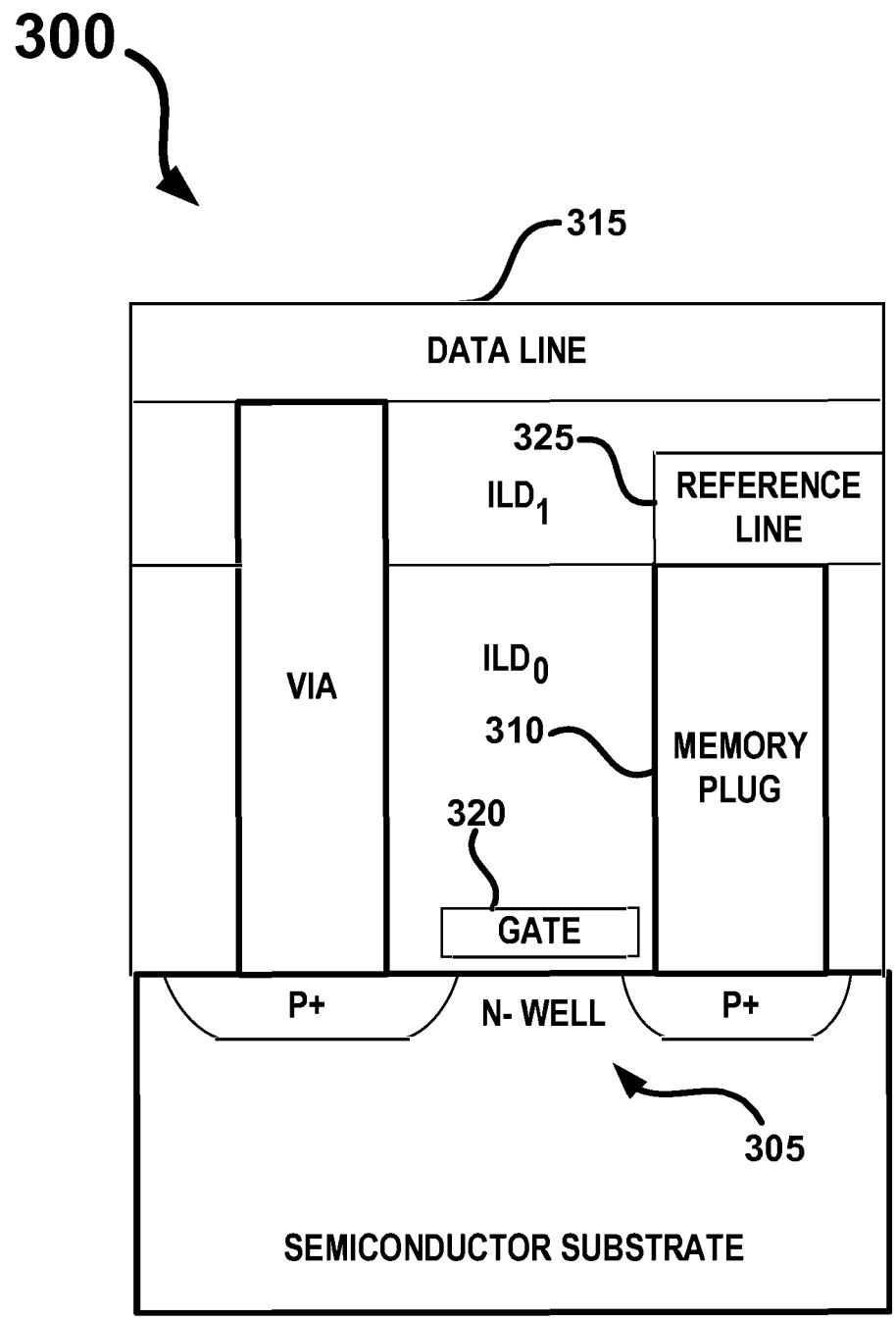
FIG. 3 depicts a generalized representation of a memory cell that can be used in a transistor memory array.

FIG. 3 is a generalized diagrammatic representation of a memory cell 300 that can be used in a transistor memory array. Each memory cell 300 includes a transistor 305 and a memory plug 310. The transistor 305 is used to permit current from the data line 315 to access the memory plug 310 when an appropriate voltage is applied to the select line 320, which is also the transistor's gate. The reference line 325 might span two cells if the adjacent cells are laid out as the mirror images of each other. U.S. patent application, "Non-Volatile Memory with a Single Transistor and Resistive Memory Element," U.S. application Ser. No. 10/249,848, filed May 12, 2003, now issued U.S. Pat. No. 6,856,536, incorporated herein by reference in its entirety for all purposes, describes the specific details of designing and fabricating a transistor memory array.

The Memory Plug

Each memory plug 255 or 310 contains a multi-resistive state element (described later) along with any other materials that may be desirable for fabrication or functionality. For example, the additional materials might include a non-ohmic device, as is described in application "High Density NVRAM," U.S. application Ser. No. 10/360,005, filed Feb. 7, 2003, now issued U.S. Pat. No. 6,917,539, incorporated herein by reference in its entirety for all purposes. The non-ohmic device exhibits a very high resistance regime for a certain range of voltages ($V_{NO-}$ to $V_{NO+}$) and a very low resistance regime for voltages above and below that range. The non-ohmic device, either alone or in combination with other elements, may cause the memory plug 255 or 310 to exhibit a non-linear resistive characteristic. Exemplary non-ohmic devices include three-film metal-insulator-metal (MIM) structures and back-to-back diodes in series.

Furthermore, as described in "Rewriteable Memory With Non-Linear Memory Element," U.S. application Ser. No. 10/604,556, filed Jul. 30, 2003, now issued U.S. Pat. No. 6,870,755, incorporated herein by reference in its entirety for all purposes, it may also be possible for the memory cell exhibit non-linear characteristics without a separate non-ohmic device. It should be noted that since it is possible for a memory cell to exhibit non-linear characteristics the terms "resistive memory" and "resistive device" also apply to memories and devices showing non-linear characteristics, and can also be referred to as "conductive memory" and "conductive device." While a non-ohmic device might be desirable in certain arrays, it may not be helpful in other arrays. Regardless, if certain treatments are used to improve the switching characteristics of the memory plug the treatments may also create an integrated non-ohmic device. Such a non-ohmic device may, therefore, be used even if it is not necessary in that type of array.

Electrodes will typically be desirable components of the memory plugs 255 or 310, a pair of electrodes sandwiching the multi-resistive state element. If the only purpose of the electrodes is as a barrier to prevent metal inter-diffusion, then a thin layer of metal, e.g. TiN, Pt, Au, Ag and Al could be used. However, conductive oxide electrodes may provide advantages beyond simply acting as a metal inter-diffusion barrier. U.S. patent application, "Conductive Memory Device With Barrier Electrodes," U.S. application Ser. No. 10/682,277, filed Oct. 8, 2003, now issued U.S. Pat. No. 7,067,862, incorporated herein by reference in its entirety for all purposes, describes electrodes (formed either with a single layer or multiple layers) that prevent the diffusion of metals, oxygen, hydrogen and water, act as a seed layer in order to form a good lattice match with the conductive memory element, include adhesion layers, and reduce stress caused by uneven coefficients of thermal expansion, and provide other benefits. Additionally, the choice of electrode layers in combination with the multi-resistive state element layer may affect the properties of the memory plug 255 or 310, as is described in U.S. patent application, "Resistive Memory Device With A Treated Interface," U.S. application Ser. No. 10/665,882, filed Sep. 19, 2003, now issued U.S. Pat. No. 7,326,979, incorporated herein by reference in its entirety for all purposes.

Figure 7:
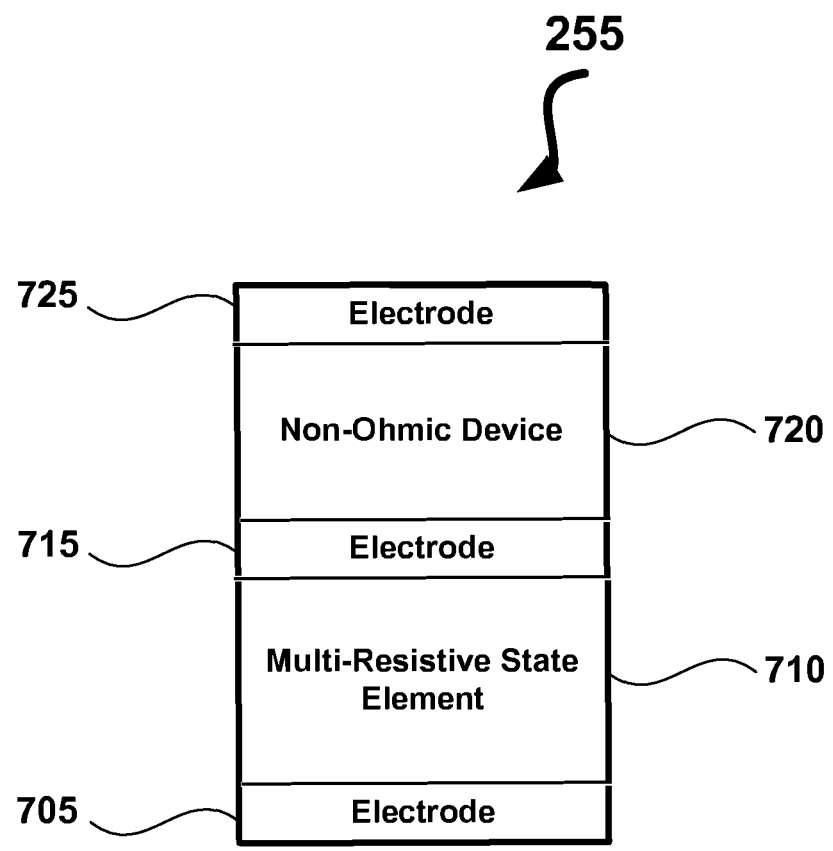
FIG. 7 depicts an elevation view of an exemplary memory plug with five layers.

Typical electrodes 705, 715 and 725 (see FIG. 7) commonly used in fabrication include Pt, Au, Ag and Al. If the only purpose of the electrodes 705, 715 and 725 is as a barrier to prevent metal inter-diffusion, then a thin layer of metal, e.g. TiN, could be used. However, conductive oxide electrodes may provide advantages beyond simply acting as a metal inter-diffusion barrier.

For example, a conducting oxide electrode might modify the formation and migration of oxygen vacancies in the memory material. Oxygen vacancies can cause degradation of electrical properties in the multi-resistive state element 710 (see FIG. 7). A conducting oxide electrode can also withstand high temperature processing. Most metals either start oxidizing or combining with adjacent materials at temperatures above 400° C. Accordingly, fabrication processes above these temperatures can be considered to be high temperature processing. Additionally, conducting oxide electrodes will not degrade during operation. Regular metal electrodes may degrade due to the electric field and interaction between the metal atoms and the memory material atoms.

Examples of conductive oxides include $LaSrCoO_3$, $RuO_2$, $IrO_2$, $SrRuO_3$, $LaNiO_3$ and doped strontium titanate (STO). The dopant used in STO can be either Nb or Ta to substitute for titanium atoms, or any rare earth such as La or Pr to substitute for strontium atoms. Generally, a conducting oxide electrode is metallic with resistivity below 1 $\Omega$-cm.

Conducting oxide electrodes can be fabricated directly, or can be made with a material that is not initially an oxide, but is subsequently oxidized during further processing or operation. Ru and Ir are both examples of materials that can be oxidized during processing or operation.

Additionally, certain materials oxidize at a finite rate and allow dual layers to form. For example, Ir might be particularly well suited for making contact to an underlying conductive array line layer 105. When Ir is oxidized, the top of the Ir layer becomes $IrO_2$. Since the $IrO_2$ grows at a finite rate it becomes possible to control the oxidation so that a dual layer of $Ir/IrO_2$ is formed. Such a dual layer could provide a good contact on the un-oxidized bottom while still forming an oxygen barrier on the oxidized top.

Furthermore, some conductive oxides electrodes form a good lattice match with the multi-resistive state element 710, and thus lower crystallization temperature for the resistive material. For example, if the multi-resistive state element 710 is STO, possible conductive oxide electrodes that make a good lattice match include doped STO, LaSrCoO$_3$, and SrRuO$_3$. If the multi-resistive state element 710 is PCMO, possible conductive oxide electrodes include the STO electrodes and also LaNiO$_3$. A seed layer will often be used on top of the thin layer of metal. A seed layer will help the formation of the layer grown or deposited above it. For example, the seed layer could be on Pt, Ru, Ir or TiN. Some seed layer/metal layer matches include LaNiO$_3$ or SrRuO$_3$ on Pt, IrO$_2$ on Ir, RuO$_2$ on Ru, and Pt on TiN.

Another benefit to certain conductive oxide electrodes is that stress may be reduced by more closely matching the conductive oxide electrode's coefficient of thermal expansion to the multi-resistive state element 710.

The electrodes 705, 715 and 725 might be further improved by using a layer of metal such as platinum between the multi-resistive state element layer 710 and the conductive oxide electrode. Such implementations advantageously provide a good barrier with the conductive oxide, and a good contact with an adjacent metal layer.

Barrier layers are generally helpful to prevent inter-diffusion of atoms after different materials have been deposited. For example, barrier layers can block the diffusion of metals, oxygen, hydrogen or water. Binary oxides or nitrides with 2 elements and ternary oxides or nitrides with 3 elements are particularly suited to high temperature processing. Unlike a regular electrode like titanium that oxidizes and becomes non-conductive, titanium nitride will not oxidize and will remain conductive until about 500° C. Ternary oxides oxidize at even higher temperatures, typically about 50° C. higher than binary oxides. The rate of oxidation depends on the temperature and the oxygen partial pressure.

Examples of binary nitrides include titanium nitride, tantalum nitride and tungsten nitride. Examples of ternary nitrides include titanium silicon nitride, tantalum aluminum nitride, tantalum silicon nitride, and ruthenium titanium nitride. An example of a ternary oxide is ruthenium tantalum oxide.

As will be appreciated by those skilled in the art, an electrode may require other layers, in order to properly function. For example adhesion layers are sometimes necessary. An adhesion layer is used between a substrate and thin-film layer to improve adhesion of the thin-film layer to substrate. Pt does not stick well to SiO$_2$, so a glue layer, such as Ti or TiO$_2$, is used between them for better adhesion. Similarly, a sacrificial barrier layer is an oxide layer that is deposited for the sole purpose of capturing all the oxygen that could otherwise diffuse into other layers, such as the multi-resistive state element 710. The electrode 705 is considered to consist of everything in between x-direction conductive array line 210 and the multi-resistive state element 710, including any adhesion or sacrificial barrier layers, as required. Similarly, the electrode 715 consists of all layers between the multi-resistive state element 710 and the non-ohmic device 720 and the electrode 725 consists of everything in between the non-ohmic device 720 and the y-direction conductive array line 215.

For example, an electrode may include a TiN or TiAlN layer, an Ir layer and an IrO$_2$ layer to have good metal barrier and oxygen barrier properties. However, such additional layers are only necessary to the extent they are required.

Certain conductive oxide electrodes may provide multiple functions. For example, ternary nitrides and ternary oxides that have one component that is either ruthenium or iridium and another component that is either tantalum or titanium can act as both a barrier layer and a sacrificial high-temperature oxygen barrier.

It will be appreciated that the choice of electrode layers 705, 715 and 725 in combination with the multi-resistive state element layer 710 may affect the properties of the memory plug 255 or 310.

The multi-resistive state element will generally (but not necessarily) be crystalline—either as a single crystalline structure or a polycrystalline structure. One class of multi-resistive state element are perovskites that include two or more metals, the metals being selected from the group consisting of transition metals, alkaline earth metals and rare earth metals. The perovskites can be any number of compositions, including manganites (e.g., Pr$_{0.7}$Ca$_{0.3}$MnO$_3$, Pr$_{0.5}$Ca$_{0.5}$MnO$_3$ and other PCMOs, LCMOs, etc.), titanates (e.g., STO:Cr), zirconates (e.g., SZO:Cr), other materials such as Ca$_2$Nb$_2$O$_7$:Cr, and Ta$_2$O$_5$:Cr, and high Tc superconductors (e.g., YBCO). Specifically, MnO$_3$, when combined with the rare earth metals La, Pr or some combination thereof and the alkaline earth metals Ca, Sr or some combination thereof have been found to produce a particularly effective multi-resistive state element for use in the memory plug 255 or 310. The compounds that make up the perovskite class of multi-resistive state elements include both simple conductive metal oxides and complex conductive metal oxides. Further, some oxides that may not be conductive in their pure form may be used as they become conductive through the addition of dopants, or if they are used as a very thin layer (e.g., in the order of tens of Angstroms) in which case tunneling conduction can be achieved. Therefore, as will be appreciated by those skilled in the art, the terms "conductive memory," "conductive element," and "conductive device" can include devices that are fabricated with materials that are classified as insulators, but are thin enough to allow tunneling conduction.

Multi-resistive state elements, however, are not limited to perovskites. Specifically, any conductive element (composed of either a single material or a combination of materials) that has a hysteresis that exhibits a resistive state change upon application of a voltage while allowing non-destructive reads is a good candidate for a multi-resistive state element. A non-destructive read means that the read operation has no effect on the resistive state of the memory element. Measuring the resistance of a memory cell is accomplished by detecting either current after the memory cell is held to a known voltage, or voltage after a known current flows through the memory cell. Therefore, a multi-resistive state element that is placed in a high resistive state $R_0$ upon application of $-V_W$ and a low resistive state $R_1$ upon application of $+V_W$ should be unaffected by a read operation performed at $-V_R$ or $+V_R$. In such materials a write operation is not necessary after a read operation. The same principle applies if more than one resistive state is used to store information (e.g., the multi-resistive state element has a high resistive state of $R_{00}$, a medium-high resistive state of $R_{01}$, a medium-low resistive state of $R_{10}$ and a low resistive state of $R_{11}$).

As described in U.S. patent application, "A 2-Terminal Trapped Charge Memory device with Voltage Switchable Multi-Level Resistance," U.S. application Ser. No. 10/634,636, filed Aug. 4, 2003, now issued U.S. Pat. No. 7,038,935, incorporated herein by reference in its entirety for all purposes, trapped charges are one mechanism by which the hysteresis effect is created. Trapped charges can be encouraged with dopants, as described in U.S. patent application, "Multi-Resistive State Material that Uses Dopants," U.S. application Ser. No. 10/604,606, filed Aug. 4, 2003, now issued U.S. Pat. No. 7,071,008, incorporated herein by reference in its entirety for all purposes.

Treating the Conductive Element

Properties of the multi-resistive state elements can be further enhanced, or even created, with certain treatments. For example, a reactive metal, such as Al, Ti, Mg, W, Fe, Cr, V, Zn, Ta or Mo can create a differential between the high resistive state and the low resistive state in a conductive metal oxide that does not exhibit switching properties in an untreated condition. Similarly, a reactive metal can enhance the switching properties of a conductive element that already exhibits switching properties. The reactive metal reacts with the conductive element and forms a layer of reacted metal, therefore creating a multi-resistive state element with enhanced properties. Furthermore, following the deposition of the reactive metal with an anneal (e.g., 400° C. in an argon (Ar) or similarly non-reactive environment) can give the memory plug a more stable structure.

The reactive metal can additionally create a non-ohmic device within the multi-resistive state element. Typically, the thicker the layer of reacted metal is, the greater the range of voltages $V_{NO-}$ to $V_{NO+}$. However, there is a limit to how much reactive metal can diffuse and react with the conductive element.

For example, if 500 Å of Al were used on a PCMO perovskite, only the first 100 Å may fully react with the underlying conductive element. The unreacted portion of the reactive metal might then cause the memory plug to have degraded properties. Furthermore, the best switching properties may not coincide with the largest range of voltages $V_{NO-}$ to $V_{NO+}$. Although most applications would use between 10 Å and 100 Å of reactive metal, between 25 Å and 50 Å would typically be preferred in most conditions. Those skilled in the art will appreciate that such reactive metal layers would be considered "very thin" layers. Very thin layers typically describe any layer that is less than 200 Å.

Figure 5A:
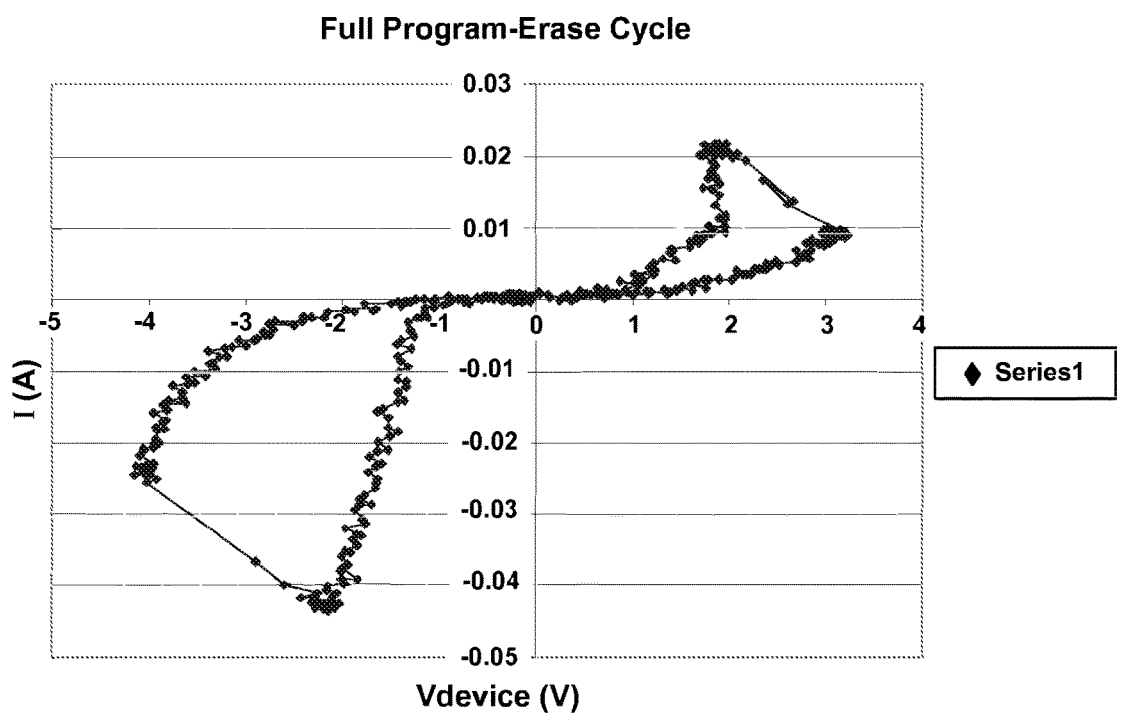
FIG. 5A is a chart of measurements across a multi-resistive state memory element after a layer of reactive metal has been deposited.
Figure 5B:
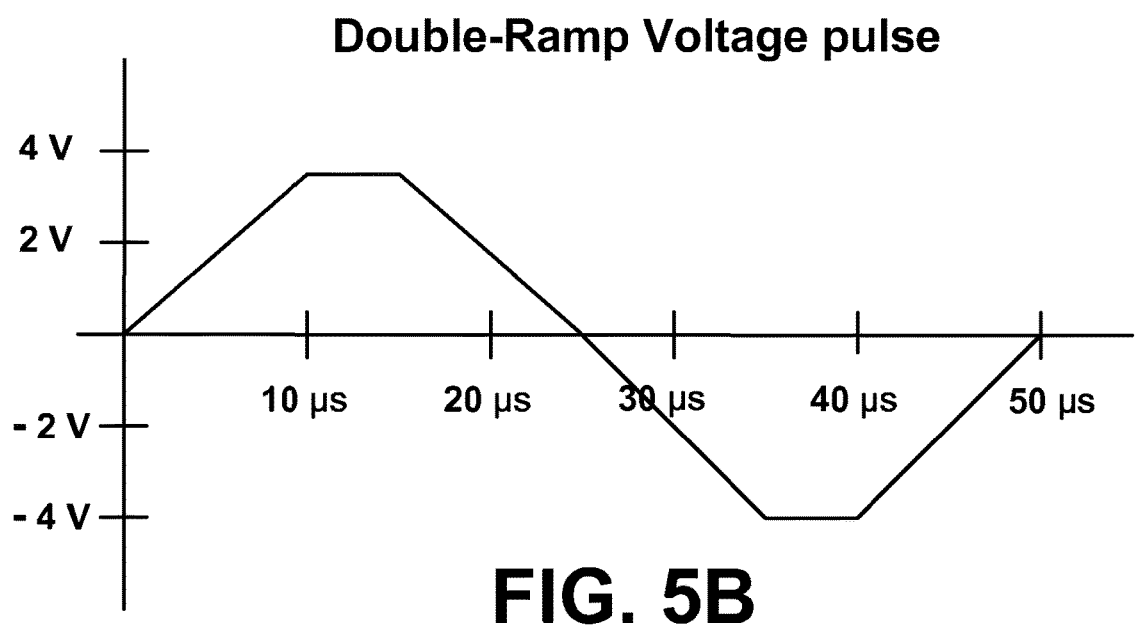
FIG. 5B is a chart depicting the double ramp voltage pulse used to for the measurements of FIG. 5A.

By monitoring current through a resistance set in series with the multi-resistive state element, and graphing this current versus an applied pulse shaped as a double ramp, an I-V curve can be obtained which shows the switching of the memory element in real time. This contrasts with standard I-V curves, which are taken with a very slow ramp, in the order of tens of millisecond, and only represent the DC functionality of the memory element. FIG. 5A is a chart of measurements across a multi-resistive state memory element after a layer of reactive metal has been deposited, using a pulse with a 10 µs positive ramp, 5 µs high or low level at +3.5 and −4V, and a 10 µs negative ramp, as shown in FIG. 5B.

Figure 5C:
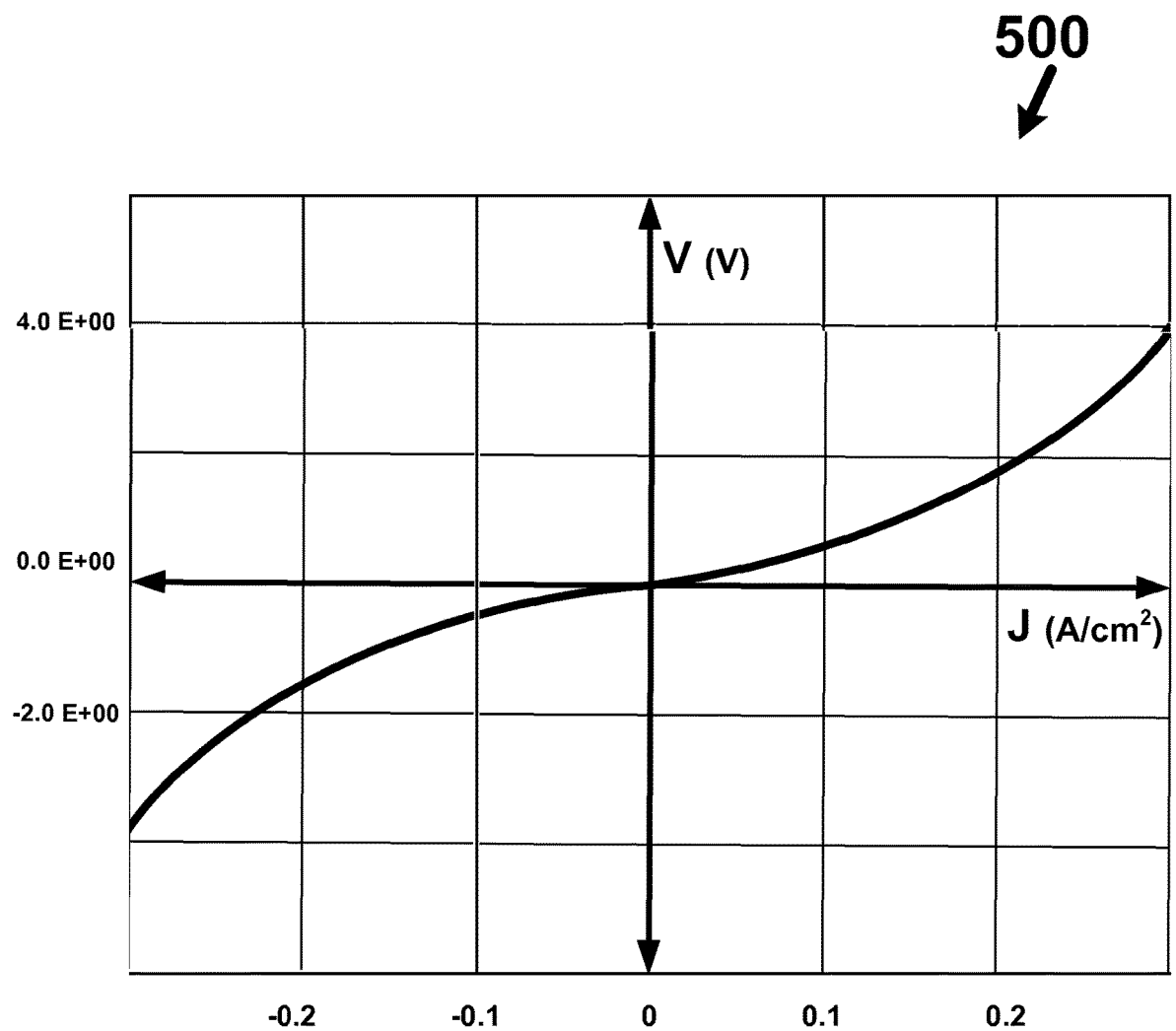
FIG. 5C depicts a graph of one example of a non-linear I-V characteristic of a discrete two-terminal memory element.

FIG. 5C graphically depicts one example of a non-linear I-V characteristic 500 for a discrete re-writeable non-volatile two-terminal resistive memory element (e.g., memory element 255, 310, 710) having integral selectivity due to its non-linear I-V characteristics and the non-linear I-V characteristic is maintained regardless of the value of the data stored in the memory cell, that is the I-V characteristic of the memory element does not change from non-linear to linear as a function of the resistive state stored in the memory element. Therefore, the non-linear I-V characteristic of the memory element is non-linear for all values of stored data (e.g., resistive states). Voltage V applied across the memory element is plotted on the Y-axis and current density J through the memory element is plotted on the X-axis. Here, current through the memory element is a non-linear function of the applied voltage across the memory element. Accordingly, when voltages for data operations (e.g., read and write voltages) are applied across the memory element, current flow through the memory element does not significantly increase until after a voltage magnitude of about 2.0V (e.g., at ≈0.2 A/cm²) is reached (e.g., a read voltage of about 2.0V across the memory element). An approximate doubling of the voltage magnitude to about 4.0V does not double the current flow and results in a current flow of ≈0.3 A/cm². The graph depicted is only an example and actual non-linear I-V characteristics will be application dependent and will depend on factors including but not limited to an area of the memory element (e.g., area determines the current density J) and the thin-film materials used in the memory element, just to name a few. The area of the memory element will be application dependent. Here, the non-linear I-V characteristic of the discrete memory element applies to both positive and negative values of applied voltage as depicted by the non-linear I-V curves in the two quadrants of the non-linear I-V characteristic 500. One advantage of a discrete re-writeable non-volatile two-terminal resistive memory element that has integral selectivity due to a non-linear I-V characteristic is that when the memory element is half-selected (e.g., one-half of the magnitude of a read voltage or a write voltage is applied across the memory element) during a data operation to a selected memory cell(s), the non-linear I-V characteristic is operative as an integral quasi-selection device and current flow through the memory element is reduced compared to a memory cell with a linear I-V characteristic. Therefore, a non-linear I-V characteristic can reduce data disturbs to the value of the resistive state stored in the memory element when the memory element is un-selected or is half-selected. In other embodiments, the memory element (e.g., memory element 100, 200) has a non-linear I-V characteristic for some values of the resistive state stored in the memory element and a linear I-V characteristic for other values of the resistive state stored in the memory element.

Fabrication

Figure 4:
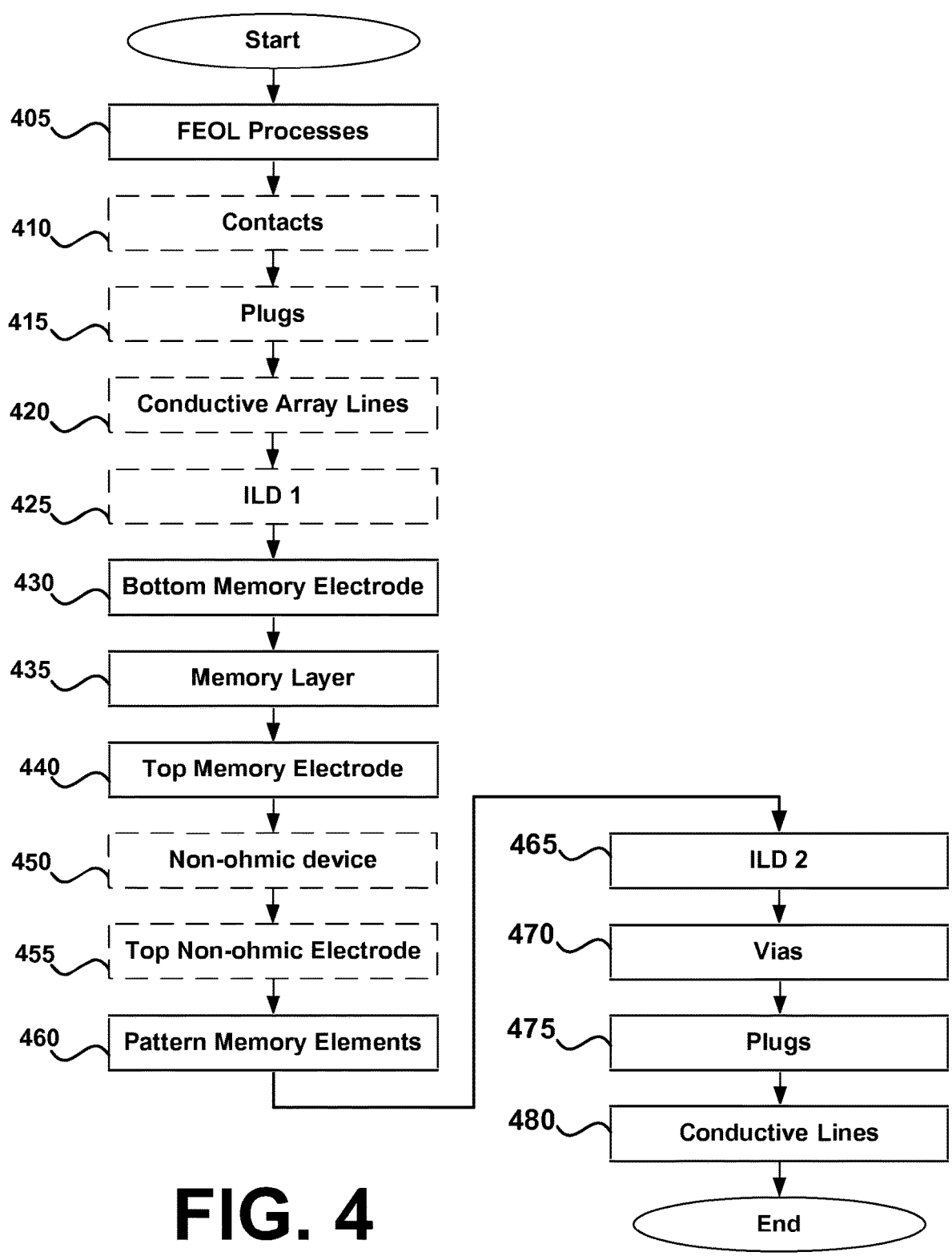
FIG. 4 depicts an exemplary flow chart of various processing steps that could be involved in fabrication of a memory.

FIG. 4 is an exemplary flow chart of various processing steps that could be involved in fabrication of a memory. At 405, standard front end of line (FEOL) processes can be used to form the active circuitry that drives the cross point memory array. FEOL processes are generally defined as operations performed on a semiconductor wafer in the course of device manufacturing up to first metallization, and might end with chemical-mechanical polishing (CMP) of an inter-layer dielectric (ILD). Certain cross point arrays, especially those with active circuitry underneath the memory array, might also include various metallization layers in step 405. The metallization layers are used to electrically connect the active circuitry to the conductive array lines of the cross point array 100 or 150.

The next processing step at 410 is formation of contact holes through the ILD to appropriate positions in the active circuitry (or metallization layers in the case of some cross point arrays) followed by plug formation at 415. Certain transistor memory arrays may require these steps if, for example, the memory plug 310 were so wide that it would overlap the transistor's gate 320. Otherwise, the memory plug 310 could be formed directly on top of the semiconductor substrate 305.

Once the plugs are formed, a cross point array 100 or 150 would require that the conductive array lines be patterned on the wafer at 420. If refractory metals with relatively high resistivities are used for the conductive array lines, the maximum length and minimum cross-sectional area may be limited in comparison to aluminum or copper.

Another ILD layer could be deposited over the first layer of conductive array lines at 425. The dielectric layer can be deposited over the conductive array lines by plasma-enhanced chemical vapor deposition (PECVD) and then planarized by CMP to expose the top surfaces of the conductive array lines.

At 430 the memory plug formation begins. In the case of transistor memory array, the memory plug can be formed directly on the contact hole plugs. In the case of a cross point array, the memory plugs are formed on the bottom conductive array lines.

Regardless of the memory array, a memory plug generally begins with the deposition of the bottom electrodes at 430. At 435 the multi-resistive state elements are deposited, typically using high temperature processing (e.g., solution based spin on followed by high temperature anneal, pulsed laser deposition, sputtering, and metal-organic chemical vapor deposition). However, U.S. patent applications, "Laser Annealing of Complex Metal Oxides (CMO) Memory Materials for Non-Volatile Memory Integrated Circuits," U.S. application Ser. No. 10/387,799, now issued U.S. Pat. No. 7,309,616, and "Low Temperature Deposition of Complex Metal Oxides (CMO) Memory Materials for Non-Volatile Memory Integrated Circuits," U.S. application Ser. No. 10/387,773, now issued U.S. Pat. No. 7,063,984, both filed Mar. 13, 2003, and both incorporated herein by reference in their entireties for all purposes, describe fabrication techniques that may be able to be used in lieu of high temperature fabrication processes. If high temperature fabrication were used, then all the circuitry elements that were deposited before the multi-resistive state element would need to withstand those high temperatures. Using refractory metals are one technique that can be used to create elements that can endure high temperatures.

It should also be appreciated that fabrication of the multi-resistive state element might include additional techniques in order to ensure an effective memory device. For example, biasing the multi-resistive state element might be beneficial in order to ensure the hysteresis is presented in a certain direction. U.S. patent application, "Multi-Layer Conductive Memory Device," U.S. application Ser. No. 10/605,757, filed Oct. 23, 2003, now issued U.S. Pat. No. 6,965,137, incorporated herein by reference in its entirety for all purposes describes using a multi-layered multi-resistive state element in order to encourage a hysteresis in a certain direction. As previously discussed, a reactive metal can also be a desirable addition to the multi-resistive state element.

At 440 another electrode is deposited on top of the multi-resistive state element. At 450 the optional non-ohmic device is formed. If the non-ohmic device is a MIM structure, a top electrode layer may or may not be necessary at 455. In addition, this top electrode layer could include a barrier layer to prevent metal inter-diffusion.

At 460 standard photolithography and appropriate multistep etch processes could be used to pattern the memory/non-ohmic film stack into memory cell plugs. U.S. patent application, "Conductive Memory Stack With Non-Uniform Width," U.S. application Ser. No. 10/605,963, now issued U.S. Pat. No. 7,009,235, filed Nov. 10, 2003, incorporated herein by reference in its entirety for all purposes describes an improved fabrication technique that includes etching a memory plug with a non-uniform width and using a sidewall layer around the memory plug.

At 465 depositing another ILD, which can then be planarized by CMP, fills in the spaces between the plugs. At 470 via holes are formed in the ILD. Via holes could be formed to connect the tops of the memory cell islands and are one mechanism that can be used to provide connections between metal interconnect layers. The via holes are then filled at 475.

The top layer(s) of conductive array lines could then be formed at 480. If there are no more memory elements to form at high temperature, the final layer(s) of conductive array lines may comprise aluminum, copper or other high conductivity metal.

Concluding Remarks

Although the invention has been described in its presently contemplated best mode, it is clear that it is susceptible to numerous modifications, modes of operation and embodiments, all within the ability and skill of those familiar with the art and without exercise of further inventive activity. For example, instead of limiting how much reactive metal is deposited on top of the multi-resistive state element, any excess unreacted material can simply be polished off with CMP. Accordingly, that which is intended to be protected by Letters Patent is set forth in the claims and includes all variations and modifications that fall within the spirit and scope of the claim.

What is claimed is:

1. A memory plug comprising:
   a multi-resistive state element, wherein the multi-resistive state element comprises:
   a conductive layer; and
   a reactive metal that reacts with the conductive layer, wherein the memory plug is capable of reversibly switching from a first resistive state to a second resistive state.

2. The memory plug of claim 1, wherein the reactive metal is fully reacted with the conductive layer.

3. The memory plug of claim 1, wherein the memory plug is exposed to a range of voltages without disturbing the resistive states of the memory plug.

4. The memory plug of claim 1, further comprising:
   at least two electrodes.

5. The memory plug of claim 4, wherein at least one of the at least two electrodes is Pt.

6. The memory plug of claim 1, wherein the conductive layer is a conductive metal oxide.

7. The memory plug of claim 1, wherein the reactive metal is one or more of Al, Ti, Mg, W, Fe, Cr, Vn, Zn, Ta or Mo.

8. The memory plug of claim 1, wherein the multi-resistive state element has a non-ohmic characteristic such that the multi-resistive state element exhibits:
   a high resistance regime for a range of voltages; and
   a resistance indicative of the first resistive state or the second resistive state for voltages outside of the range of voltages.

9. The memory plug of claim 8, further comprising:
   a non-ohmic device coupled in series with the multi-resistive state element, wherein the non-ohmic device is configured to operatively effectuate the non-ohmic characteristic.

10. The memory plug of claim 9, wherein the non-ohmic device includes the reactive metal.

11. The memory plug of claim 8, further comprising:
    an integrated non-ohmic device coupled in series with the multi-resistive state element, wherein the integrated non-ohmic device is configured to operatively effectuate the non-ohmic characteristic.

12. The memory plug of claim 11, wherein the integrated non-ohmic device includes the reactive metal.

13. The memory plug of claim 1, wherein the memory plug is non-volatile such that the first resistive state or the second resistive state is retained in absence of power.

14. The memory plug of claim 1, wherein a thickness of the reactive metal is less than 200 Angstroms.

15. The memory plug of claim 14, wherein the thickness of the reactive metal is less than 100 Angstroms.

16. The memory plug of claim 1, wherein the reactive metal is annealed.

17. A memory cell comprising:
    a memory plug comprising:
        a multi-resistive state element, wherein the multi-resistive state element comprises:
            a conductive layer, and
            a reactive metal that reacts with the conductive layer, the memory plug being capable of reversibly switching from a first resistive state to a second resistive state;
    an electrode; and
    a transistor configured to permit current from the electrode to access the memory plug when a voltage is applied to a gate of the transistor.

18. The memory cell of claim 17, wherein the reactive metal is fully reacted with the conductive layer.

19. The memory cell of claim 17, wherein the memory plug can be exposed to a range of voltages without disturbing the first resistive state of the memory plug.

* * * * *